US010294672B2

(12) United States Patent
Akkashian et al.

(10) Patent No.: US 10,294,672 B2
(45) Date of Patent: *May 21, 2019

(54) MULTIFUNCTIONAL PHOTOVOLTAIC SKYLIGHT WITH DYNAMIC SOLAR HEAT GAIN COEFFICIENT AND/OR METHODS OF MAKING THE SAME

(71) Applicant: GUARDIAN GLASS, LLC, Auburn Hills, MI (US)

(72) Inventors: Eric Walter Akkashian, Waterford, MI (US); Willem Den Boer, Brighton, MI (US)

(73) Assignee: Guardian Glass, LLC, Auburn Hills, MI (US)

( * ) Notice: Subject to any disclaimer, the term of this patent is extended or adjusted under 35 U.S.C. 154(b) by 70 days.

This patent is subject to a terminal disclaimer.

(21) Appl. No.: 14/035,479

(22) Filed: Sep. 24, 2013

(65) Prior Publication Data

US 2014/0053477 A1    Feb. 27, 2014

Related U.S. Application Data

(63) Continuation-in-part of application No. 13/477,400, filed on May 22, 2012, now Pat. No. 9,151,879, (Continued)

(51) Int. Cl.
*F24S 23/30*      (2018.01)
*E04D 13/035*   (2006.01)
(Continued)

(52) U.S. Cl.
CPC ............ *E04D 13/035* (2013.01); *F24S 25/00* (2018.05); *G02B 3/005* (2013.01); *G02B 3/0056* (2013.01);
(Continued)

(58) Field of Classification Search
CPC .................. F24J 2/08; F24J 2/06; F24J 2/062
See application file for complete search history.

(56) References Cited

U.S. PATENT DOCUMENTS 3,682,528 A      8/1972   Apfel et al.
3,991,741 A  *  11/1976   Northrup, Jr. ............. F24J 2/08
                                                                126/578
(Continued)

FOREIGN PATENT DOCUMENTS

FR         2 327 643              5/1977
FR         2979714 A1  *  3/2013  ............... F24J 2/062
(Continued)

OTHER PUBLICATIONS

U.S. Appl. No. 12/292,346, Fulton et al., "Photovoltaic Device Using Low Iron High Transmission Glass with Antimony and Reduced Alkali Content and Corresponding Method," filed Nov. 17, 2008.

(Continued)

*Primary Examiner* — Thanh Luu
(74) *Attorney, Agent, or Firm* — Nixon & Vanderhye P.C.

(57) ABSTRACT

Improved building-integrated photovoltaic systems according to certain example embodiments may include concentrated photovoltaic skylights or other windows having a cylindrical lens array. The skylight may include an insulated glass unit, which may improve the Solar Heat Gain Coefficient (SHGC). The photovoltaic skylight and lens arrays may be used in combination with strip solar cells. Arrangements that involve lateral displacement tracking systems, or static systems (e.g., that are fixed at one, two, or more predefined positions) are contemplated herein. Such techniques may advantageously help to reduce cost per watt related, in part, to the potentially reduced amount of semiconductor material to be used for such example embodiments. A photovoltaic skylight may permit diffuse daylight (Continued)

to pass through into an interior of a building so as to provide lighting inside the building, while the strip solar cells absorb the direct sunlight and convert it to electricity, providing for SHGC tuning.

17 Claims, 19 Drawing Sheets

Related U.S. Application Data which is a continuation-in-part of application No. 12/662,624, filed on Apr. 26, 2010, now Pat. No. 9,423,533.

(51) Int. Cl.
| F24S 25/00 | (2018.01) |
| G02B 3/00 | (2006.01) |
| H01L 31/052 | (2014.01) |
| H01L 31/054 | (2014.01) |
| H02S 20/26 | (2014.01) |

(52) U.S. Cl.
CPC ........ *G02B 3/0062* (2013.01); *H01L 31/0521* (2013.01); *H01L 31/0543* (2014.12); *H01L 31/0547* (2014.12); *H02S 20/26* (2014.12); *F24S 23/31* (2018.05); *Y02A 30/62* (2018.01); *Y02B 10/10* (2013.01); *Y02B 10/20* (2013.01); *Y02E 10/52* (2013.01); *Y10T 29/49826* (2015.01)

(56) References Cited

U.S. PATENT DOCUMENTS

| 4,002,031 | A | 1/1977 | Bell | |
| 4,782,216 | A | 11/1988 | Woodard | |
| 4,965,313 | A * | 10/1990 | Onda | C08F 8/30 525/59 |
| 5,456,764 | A | 10/1995 | Asano et al. | |
| 5,644,431 | A * | 7/1997 | Magee | F24J 2/08 359/455 |
| 6,123,824 | A | 9/2000 | Sano et al. | |
| 6,288,325 | B1 | 9/2001 | Jansen et al. | |
| 6,613,603 | B1 | 9/2003 | Sano | |
| 6,686,050 | B2 | 2/2004 | Lingle et al. | |
| 6,723,211 | B2 | 4/2004 | Lingle et al. | |
| 6,730,352 | B2 | 5/2004 | Stachowiak | |
| 6,749,941 | B2 | 6/2004 | Lingle | |
| 6,782,718 | B2 | 8/2004 | Lingle et al. | |
| 6,784,361 | B2 | 8/2004 | Carlson et al. | |
| 6,802,943 | B2 | 10/2004 | Stachowiak | |
| 6,936,347 | B2 | 8/2005 | Laird et al. | |
| 7,700,869 | B2 | 4/2010 | Thomsen et al. | |
| 7,700,870 | B2 | 4/2010 | Thomsen et al. | |
| 7,767,253 | B2 | 8/2010 | Sharma | |
| 7,893,350 | B2 | 2/2011 | Thomsen et al. | |
| 8,049,098 | B2 | 11/2011 | Gibson | |
| 8,119,902 | B2 | 2/2012 | Gibson | |
| 9,151,879 | B2 | 10/2015 | Den Boer et al. | |
| 2005/0081908 | A1 | 4/2005 | Stewart | |
| 2006/0169316 | A1 | 8/2006 | Thompsen et al. | |
| 2006/0249199 | A1 | 11/2006 | Thompsen et al. | |
| 2006/0256259 | A1 * | 11/2006 | Takagi | G02F 1/133526 349/95 |
| 2007/0215205 | A1 | 9/2007 | Thompsen et al. | |
| 2009/0025777 | A1 | 1/2009 | Varaprasad | |
| 2009/0032098 | A1 | 2/2009 | Lu | |
| 2009/0068474 | A1 | 3/2009 | Lower et al. | |
| 2009/0101209 | A1 | 4/2009 | Sharma et al. | |
| 2009/0133748 | A1 | 5/2009 | Sharma | |
| 2009/0217978 | A1 | 9/2009 | Thompsen et al. | |
| 2009/0223252 | A1 | 9/2009 | Fulton et al. | |
| 2009/0250094 | A1 * | 10/2009 | Robison | F24J 2/06 136/246 |
| 2009/0277496 | A1 * | 11/2009 | Khazeni | F24J 2/08 136/246 |
| 2009/0316250 | A1 * | 12/2009 | Boman | G02F 1/13318 359/275 |
| 2010/0122728 | A1 | 5/2010 | Fulton et al. | |
| 2010/0255980 | A1 | 10/2010 | Fulton et al. | |
| 2010/0294338 | A1 | 11/2010 | Gibson et al. | |
| 2011/0094585 | A1 * | 4/2011 | Debije | C09K 19/588 136/257 |
| 2011/0157703 | A1 | 6/2011 | Broadway et al. | |
| 2011/0168232 | A1 | 7/2011 | Gibson et al. | |
| 2011/0186107 | A1 | 8/2011 | Gibson et al. | |
| 2011/0259394 | A1 | 10/2011 | Krasnov et al. | |
| 2011/0263066 | A1 | 10/2011 | Krasnov et al. | |
| 2011/0315196 | A1 | 12/2011 | Gibson et al. | |
| 2012/0037204 | A1 | 2/2012 | Sun | |
| 2012/0057236 | A1 | 3/2012 | Broadway et al. | |
| 2012/0067397 | A1 | 3/2012 | Shah et al. | |
| 2012/0196133 | A1 | 8/2012 | Broadway et al. | |
| 2012/0312900 | A1 | 12/2012 | Hashii et al. | |
| 2012/0317900 | A1 | 12/2012 | Den Boer et al. | |
| 2013/0149473 | A1 | 6/2013 | Frank et al. | |
| 2013/0196139 | A1 | 8/2013 | Lewis et al. | |
| 2013/0196140 | A1 | 8/2013 | Lewis et al. | |
| 2014/0246076 | A1 * | 9/2014 | Pilat | F24J 2/062 136/248 |

FOREIGN PATENT DOCUMENTS

| WO | WO 2005/057092 | 6/2005 |
| WO | WO 2007/143517 | 12/2007 |
| WO | WO 2009/020778 | 2/2009 |
| WO | WO 2009/137816 | 11/2009 |
| WO | WO 2010/010530 | 1/2010 |
| WO | WO 2010/099620 | 9/2010 |
| WO | WO 2011/048595 | 4/2011 |
| WO | WO 2011/101682 | 8/2011 |
| WO | WO 2011/139325 | 11/2011 |

OTHER PUBLICATIONS

U.S. Appl. No. 12/385,318, Fulton et al., "Low Iron High Transmission Glass with Boron Oxide for Improved Optics, Durability and Refining, and Corresponding Method," filed Apr. 3, 2009.

U.S. Appl. No. 13/360,898, Lewis et al., "Coated Article with Antireflection Coating Including Fullerene Structures, and/or Methods of Making the Same," filed Jan. 30, 2012.

U.S. Appl. No. 13/324,267, Frank et al., "Insulating Glass Units with Low-E and Antireflective Coatings, and/or Methods of Making the Same," filed Dec. 13, 2011.

U.S. Appl. No. 13/361,754, Lewis et al., "Coated Article with Antireflection Coating Including Porous Nanoparticles, and/or Method of Making the Same," filed Jan. 30, 2012.

U.S. Appl. No. 12/929,481, Broadway et al., "Heat Treatable Four Layer Ant-Reflection Coating," filed Jan. 27, 2011.

U.S. Appl. No. 14/035,524, Den Boer et al., "Multifunctional Static or Semi-Static Photovoltaic Skylight and/or Methods of Making the Same," filed Sep. 24, 2013.

\* cited by examiner

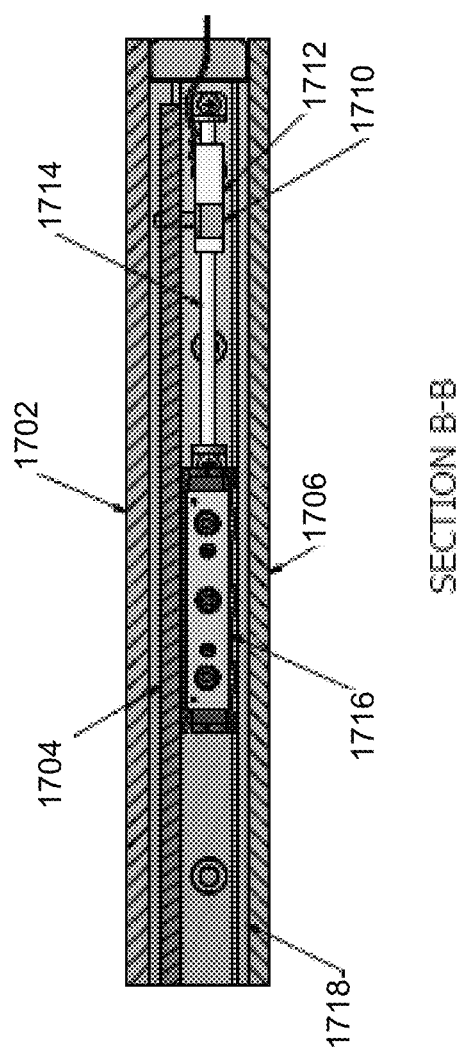

MULTIFUNCTIONAL PHOTOVOLTAIC SKYLIGHT WITH DYNAMIC SOLAR HEAT GAIN COEFFICIENT AND/OR METHODS OF MAKING THE SAME

CROSS-REFERENCES TO RELATED APPLICATIONS

This application is a continuation-in-part of U.S. application Ser. No. 13/477,400 filed May 22, 2012, which in turn is a continuation-in-part of U.S. application Ser. No. 12/662,624 filed Apr. 26, 2010, the entire contents of which are hereby incorporated herein by reference.

FIELD OF THE INVENTION

Certain example embodiments of this invention relate to improved solar photovoltaic systems, and/or methods of making the same. More particularly, certain example embodiments of this invention relate to building-integrated photovoltaic systems including concentrated photovoltaic skylights having a cylindrical lens array, and/or methods of making the same.

BACKGROUND AND SUMMARY OF EXAMPLE EMBODIMENTS OF THE INVENTION

Photovoltaic devices are known in the art (e.g., see U.S. Pat. Nos. 6,784,361, 6,288,325, 6,613,603, and 6,123,824, the disclosures of which are hereby incorporated herein by reference). Some conventional mainstream photovoltaic modules use a large number of crystalline silicon (c-Si) wafers. The inclusion of the large number of c-Si wafers tends to dominate the cost of the overall photovoltaic module. Indeed, about 60% of the costs involved in the production of conventional photovoltaic modules is related to the c-Si solar cells. To address this issue, concentrated photovoltaic (CPV) systems have been proposed, in which the sunlight is to be focused with concentration ratios of 100× to 1000×. Calculations suggest that a concentration ratio of approximately 10× should enable a photovoltaic system to be produced that uses at least 90% less silicon material.

Unfortunately, however, current concentrated photovoltaic systems use expensive high efficiency multi-junction solar cells, expensive dual-axis tracking systems, and/or relatively expensive concentrating optics. Therefore, these systems have difficulty competing with other photovoltaic solutions on a cost per watt basis.

Thus, it will be appreciated there is a need in the art for a simple low-cost CPV systems, together with low cost solar cells and low-cost concentrating optics, and/or methods of making the same.

One aspect of certain example embodiments relates to a patterned glass cylindrical lens array, and/or methods of making the same.

Another aspect of certain example embodiments relates to using such a cylindrical lens array to focus light on substantially elongate or strip solar cells.

Another aspect of certain example embodiments relates to lateral displacement tracking systems, and/or methods of making and/or using the same.

Still another aspect of certain example embodiments relates to a static or semi-static system, where the assembly is either fixed or adjustable to two or more predefined locations, e.g., to take into account seasonal and/or other variations in the solar elevation angle.

Still another aspect of certain example embodiments relates to the design of a system, where the assembly is either fixed or adjustable to two or more predefined locations, e.g., to tune the Solar Heat Gain Coefficient or SHGC (for instance, to balance heating and/or cooling, lighting, and/or other issues, potentially on a seasonal basis).

Further aspects of certain example embodiments relate to building-integrated photovoltaic systems, which may include insulating glass units comprising cylindrical lens arrays and strip solar cells. In certain examples, the photovoltaic system may be integrated into a building as an insulated glass skylight.

In certain example embodiments, a building-integrated photovoltaic (BIPV) system (e.g., photovoltaic skylight) may be provided on the roof of a building and/or other suitable structure. In certain example instances, the photovoltaic skylight may be installed on a roof at latitude tilts and may transmit diffuse daylight into the interior of the building, while converting direct sunlight into electricity at a relatively high efficiency.

In certain example embodiments of this invention, a skylight is provided. A plurality of solar cells is supported by a substrate. A lens array comprises a plurality of lenses oriented along a common cylindrical axis that is substantially parallel to the ground. Each said lens is configured to concentrate light on the solar cells, and the lens array is spaced apart from the substrate supporting the solar cells such that a gap is defined between the lens array and the substrate and such that the lens array and the solar cells remain in fixed position relative to one another.

In certain example embodiments of this invention, a skylight is provided. A plurality of solar cells is supported by a substrate. A lens array comprising a plurality of lenses is oriented along a common axis. Each said lens is configured to concentrate light on the solar cells, and the lens array is spaced apart from the substrate supporting the solar cells such that a gap is defined between the lens array and the substrate. The lens array and the solar cells are movable relative to one another as between at least first and second predefined positions.

Similar windows, BIPV devices, and/or other products also are contemplated herein. Such products may be used, for instance, in commercial and/or residential settings.

In certain example embodiments of this invention, a method of making a building integrated photovoltaic device is provided. The method may include, for example, providing a substrate supporting a plurality of generally elongate solar cells; providing a lens array comprising a plurality of lenses oriented along a common cylindrical axis; and connecting the substrate and the lens array in spaced apart but fixed relation to one another so that the cylindrical axis is substantially parallel to the ground, and so that each said lens is configured to concentrate light on the solar cells.

In certain example embodiments of this invention, a method of making a building integrated photovoltaic device is provided. The method may include, for example, providing a substrate supporting a plurality of generally elongate solar cells; providing a lens array comprising a plurality of lenses oriented along a common axis; and connecting the substrate and the lens array in spaced apart relation to one another, so that each said lens is configured to concentrate light on the solar cells. The lens array and/or the solar cells are movable relative to one another as between at least first and second predefined positions.

Corresponding methods of making skylights, BIPV devices, windows, and/or the like also are contemplated herein. For instance, a building integrated photovoltaic device made in accordance with such methods may be built into a window, skylight, etc.

In certain example embodiments of this invention, a skylight is provided. A lenticular array is provided along a common axis. A substrate supports a plurality of generally elongate solar cell strips. The lenticular array and the substrate are oriented relative to one another such that the skylight has different solar heat gain coefficients (SHGCs) during at least first and second times of the year, respectively.

The same or similar structure may be used in connection with a BIPV product, window, and/or the like, e.g., in commercial and/or residential applications. For example, in certain example embodiments of this invention, a building integrated photovoltaic (BIPV) product is provided. An array of lenses is provided along a common axis. A substrate supports a plurality of generally elongate solar cell strips. The array of lenses and the substrate are oriented relative to one another such that the skylight has different solar heat gain coefficients (SHGCs) during at least first and second times of the year, respectively. The different SHGCs are at least partially controlled by designing the skylight such that different amounts of direct sunlight impinge upon the solar cell strips at corresponding times of the year.

In a similar vein, methods of making the same or similar structure may be provided, e.g., in connection with a skylight, BIPV product, window, and/or the like, e.g., in commercial and/or residential applications. For instance, in certain example embodiments of this invention, a method of making a window is provided. The method may comprise building a building integrated photovoltaic (BIPV) product made in accordance with the methods described herein into a window.

In certain example embodiments, the BIPV system may include a photovoltaic skylight. In some cases, the photovoltaic skylight may comprise an insulated glass unit (IGU).

The features, aspects, advantages, and example embodiments described herein may be combined to realize yet further embodiments.

BRIEF DESCRIPTION OF THE DRAWINGS

These and other features and advantages may be better and more completely understood by reference to the following detailed description of exemplary illustrative embodiments in conjunction with the drawings, of which:

FIGS. 17(a)-(e) show, schematically, a view of an example multifunctional BIPV concentrating solar photovoltaic skylight in accordance with certain example embodiments;

DETAILED DESCRIPTION OF EXAMPLE EMBODIMENTS OF THE INVENTION

Photovoltaic devices such as solar cells convert solar radiation into usable electrical energy. The energy conversion occurs typically as the result of the photovoltaic effect. Solar radiation (e.g., sunlight) impinging on a photovoltaic device and absorbed by an active region of semiconductor material generates electron-hole pairs in the active region.

Certain example embodiments of this invention relate to patterned glass that can be used as a cylindrical lens array in a concentrated photovoltaic application, and/or methods of making the same. In certain example embodiments, the lens arrays may be used in combination with strip solar cells and lateral displacement tracking systems. That is, in certain example embodiments, lenses in the lens array may be arranged so as to concentrate incident light onto respective strip solar cells, and the solar cell substrate is controlled a lateral displacement tracking system that is programmed to follow the East-West movement of the sun. A low-iron glass may be used in connection with certain example embodiments. Such techniques may advantageously help to reduce cost per watt related, in part, to the potentially reduced amount of semiconductor material to be used for such example embodiments.

Figure 1:
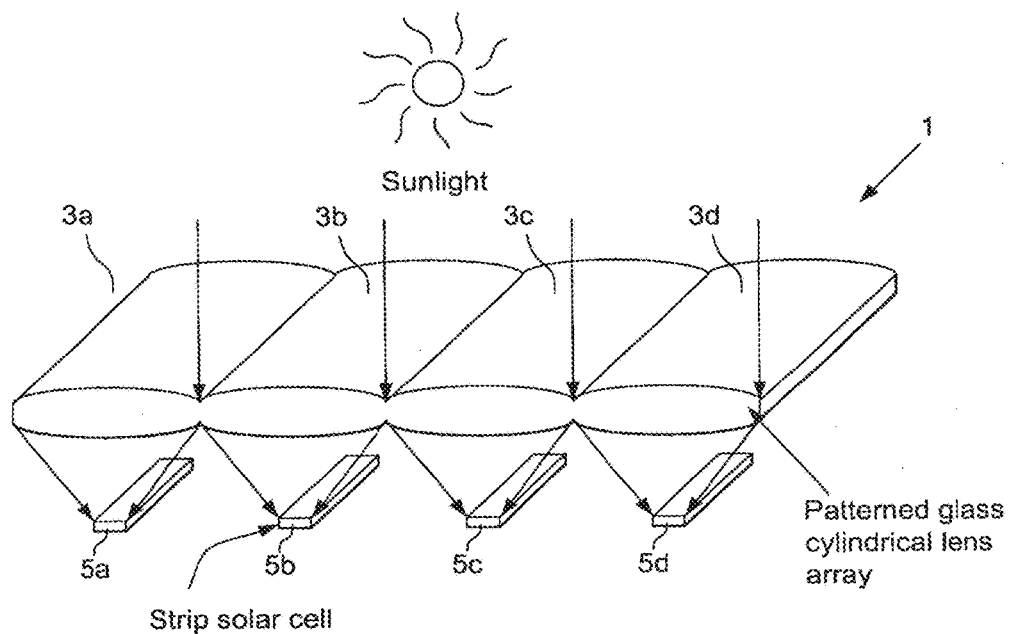
FIG. 1 is an illustrative linear focusing concentrating photovoltaic system including a cylindrical lens array made from patterned glass according to an example embodiment.

As indicated above, certain example embodiments relate to patterned glass cylindrical lens arrays, and/or methods of making the same. In this regard, FIG. 1 is an illustrative linear focusing concentrating photovoltaic system including a substantially cylindrical lens array made from patterned glass according to an example embodiment. A large flat low iron glass plate is modified into a lens array 1 by periodically modifying its thickness, e.g., at regular intervals. The lenses 3a-3d in the lens array 1 focus the sunlight from the sun in substantially one dimension, with a concentration ratio of, for example, 3× to 30×. The solar radiation may be focused on, for example, c-Si solar cells, with an efficiency of as high as 20%. Such c-Si solar cells are commercially available at reasonable costs. FIG. 1 shows the c-Si solar cells being formed as strips 5a-5d. Further details regarding these strip solar cells 5a-5d are provided below. In any event, the c-Si solar cells may be provided on a transparent substrate in different embodiments of this invention. The lenses 3a-3d in the lens array 1 are provided substantially in-line along a common axis. The lenses 3a-3d may be formed from a single piece of glass in certain example embodiments. In such cases, the lenses 3a-3d may effectively be connected to one another by virtue of being formed from a common glass substrate. Alternatively or in addition, multiple lenses and/or lens arrays may be provided adjacent to one another in different example embodiments of this invention.

Figure 2:
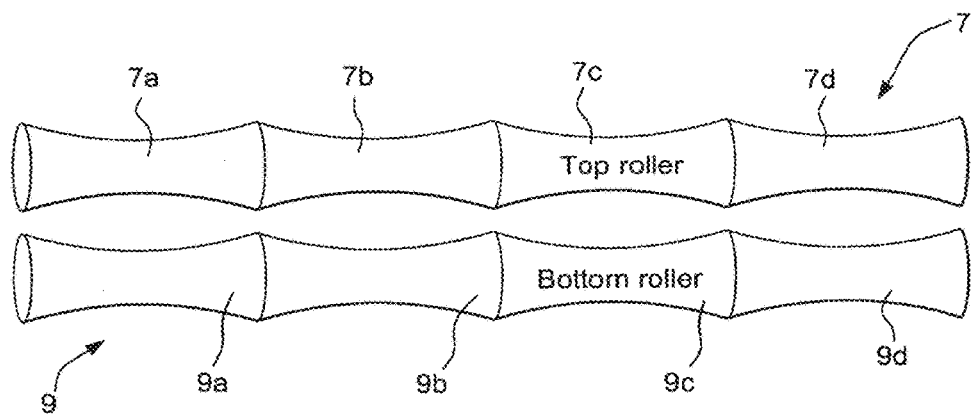
FIG. 2 is a schematic view of illustrative top and bottom roller profiles that may be used in a patterning line to obtain the lens array of certain example embodiments.

A patterning line in a glass factory may be used to create the large area cylindrical lens array of certain example embodiments. This can be done by using one or more sets of top and bottom rollers with the example profile shown in FIG. 2. That is, FIG. 2 is a schematic view of illustrative top and bottom roller profiles that may be used in a patterning line to obtain the lens array of certain example embodiments. When viewed in cross-section, the individual top and bottom rollers 7a-7d and 9a-9d in the top and bottom roller arrays 7 and 9 are concave at the top and bottom. Thus, the rollers of FIG. 2 will lead to a convex-convex lens array. Of course, it will be appreciated that a plano-convex lens array may be obtained, as well, when either the top of bottom set of rollers is flat. Other lens configurations are of course possible in different example embodiments.

Figure 3:
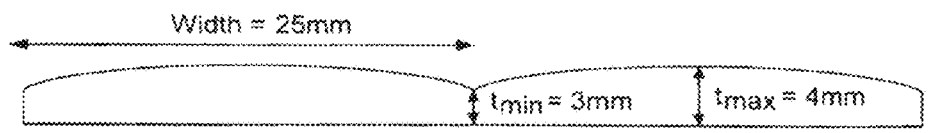
FIG. 3 shows example dimensions of lenses in a lens array in accordance with an example embodiment.

FIG. 3 shows example dimensions of lenses in a lens array in accordance with an example embodiment. Each lens in the FIG. 3 example has a pitch or width that ranges from approximately 5-100 mm, a minimum thickness or height from about 2-4 mm, and a maximum thickness or height of about 4-8 mm. Depending on the pitch, the focal length will be about 10-200 mm, e.g., from or proximate to the center of the individual lenses. Of course, it will be appreciated that the dimensions specified in FIG. 3 are provided by way of example. Indeed, different embodiments of this invention may include differently sized, shaped, and/or focal length lenses. For instance, the minimum thickness or height of certain example embodiments may be about 2 mm and the maximum thickness or height of certain example embodiments may be about 8 mm. In certain example embodiments, a 1 m$^2$ module may comprise about 10-200 lenses. The FIG. 3 example has a width of 25 mm, a minimum thickness of 3 mm, and a maximum thickness of 4 mm. These dimensions imply a height difference of 1 mm and 40 lenses per 1 m$^2$ module. In example instances, the focal length will be 150 mm, and the lens-solar cell distance may be placed at 135 mm to achieve a concentration ratio of about 10. Placing the solar cell closer to the focal point may be advantageous in certain example instances so that light is concentrated on a larger area of the solar cell.

Any suitable transparent substrate may be used in connection with certain example embodiments of this invention. For instance, certain example embodiments may incorporate a low-iron glass substrate, e.g., to help ensure that as much red and near-IR light as possible is transferred to the semiconductor absorber layer. Example low-iron glass substrates are disclosed, for example, in co-pending and commonly assigned U.S. Pat. Nos. 7,893,350; 7,700,870; and 7,700,869; and U.S. Publication Nos. 2010/0255980; 2010/0122728; 2009/0223252; and 2007/02152051, the entire contents of each of which are hereby incorporated herein by reference.

For instance, certain example embodiments may incorporate a high transmission low iron glass. Further details of example low iron glass are provided below.

In addition, the low iron glass may be thermally tempered. Such tempering may occur in certain example embodiments at the end of the production line, e.g., after the glass has been patterned in certain example instances.

Current CPV systems typically implement two-axis tracking because they use two-dimensional focusing. In this regard, current CPV systems usually are mounted on poles with individual tracking for each unit system. This arrangement increases the cost of the system. By contrast, certain example embodiments that implement cylindrical lens arrays reduce (and sometimes completely eliminate) the need for dual-axis tracking. This is because the cylindrical lens arrays of certain example embodiments are configured to linearly focus sunlight on or along a strip as opposed to a smaller point or spot location. Indeed, when the cylindrical lenses of certain example embodiments are oriented substantially vertically, simple East-West one-axis tracking may be implemented easily and efficiently.

In Table 1 the annual energy outputs from a 20% efficient system at an example location (Phoenix, Ariz.) are compared for fixed latitude tilt, one-axis tracking, and two-axis tracking systems. More particularly, the solar cells are high efficiency, back contact solar cell strips commercially available from Sunpower. The improvement in energy output going from a fixed orientation system to a one-axis tracking system is 30.7%. This is a very significant gain. However, the improvement of moving from a one-axis tracking system to a dual-axis tracking system is only an additional 5.8%. This additional 5.8% energy gain typically is offset by the expense of the dual-axis tracking system itself. Current dual-axis tracking systems therefore are not seen as economical. In any event, certain example embodiments that implement a linearly focused system are able to realize at least the efficiency gains associated with moving from a single-axis tracking system to dual-axis tracking system without actually having to incur the expenses associated with the dual-axis tracking system because such embodiments may be implemented with only one-axis tracking systems.

TABLE 1

Annual energy output per m² incident sunlight for fixed orientation, one-axis tracking, and two-axis tracking systems in Phoenix (based on NREL PVWatts Calculator)

| | PV technology | Conversion Efficiency | Annual energy generation (kWh/m²/yr) | | |
|---|---|---|---|---|---|
| | | | Fixed orientation (On roof) Lat. tilt | One-axis E-W tracking | Two-axis tracking |
| Phoenix 33° 43′ N | High eff. c-Si | 20% | 386.53 ~100% | 505.52 ~131% | 534.80 ~138% |

It will be appreciated that single-axis tracking systems advantageously can be implemented at low cost, because many modules can be oriented with a single actuator by connecting all modules to each other through parallel beams. The lens array is oriented substantially vertically and is therefore largely self-cleaning, as rain will flow down in the grooves of the patterned glass and reduce the amount of dust accumulation. Additional periodic cleaning optionally may be implemented, of course. Single-axis tracking systems also may be low to the ground, as the mechanisms for moving it are simplified compared to the mechanisms used for two-axis tracking systems.

The solar cells in the FIG. 1 example system may be manufactured economically, e.g., by cleaving strips from c-Si solar cells. For instance, a larger (e.g., 4 inch to 12 inch) wafer may be formed and subsequently cleaved to produce a plurality of strips. For concentration ratios of 3× to 30×, only about 33% to 3.3% silicon is needed, as compared to conventional c-Si modules without concentration which may require higher amounts of silicon.

As alluded to above and as suggested in the use of the term "strip" itself, the strip solar cells of certain example embodiments may have a substantially elongated shape. For instance, certain example strip solar cells may be 2 mm×150 mm, although other dimensions and/or shapes also are possible. In any event, the strip solar cells may be cleaved along the direction of its crystal orientation. The strip cells optionally may be mounted on a second glass substrate or another type of substrate in certain example embodiments. In so doing, the second substrate may be made to function as a heat sink, thereby helping to keep the operating temperature of the solar cells low and their efficiency high. Active cooling may be used in place of, or in addition to, such heat sink techniques in certain example embodiments.

In connection with example embodiments that implement strip solar cells, low-cost assembly techniques known and commonly used in, for example, the flat panel display (FPD) industry, may be used. For example, such techniques may readily be used in connection with strip solar cells having a width of 2-20 mm, and such techniques may include, for example, chip on glass (COG) manufacturing. These COG manufacturing techniques may, in turn, incorporate interconnecting wires such as, for example, patterned metals provided on the glass, copper tape, and/or the like. Certain example embodiments may incorporate solar cells with low shading or non-shading interconnects. Non-shading interconnects sometimes are used, for example, in back contact solar cells (e.g., available from Sunpower).

Figure 4:
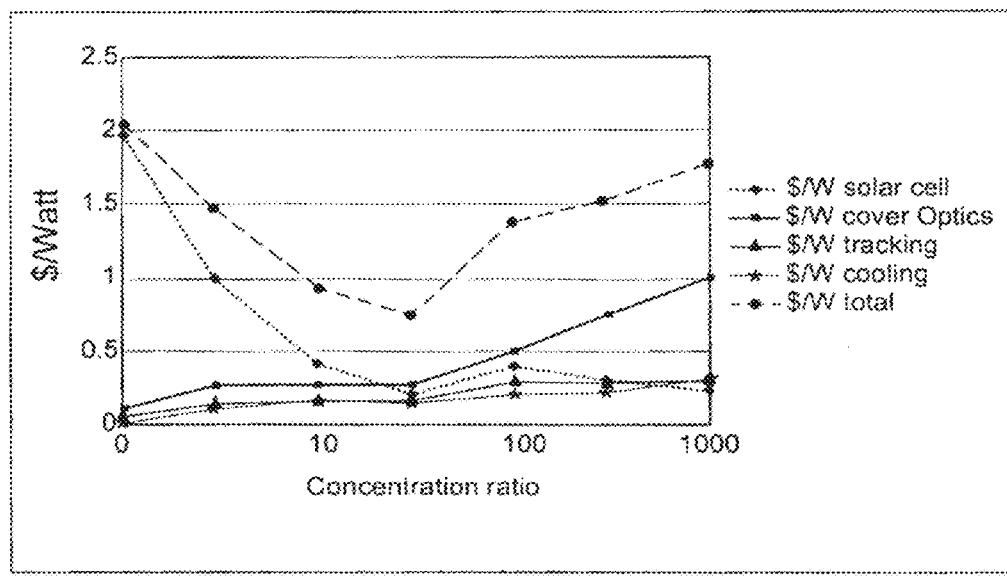
FIG. 4 is a graph showing the approximate cost per watt vs. concentration ratio (CR) of various different concentrating photovoltaic systems.

FIG. 4 is a graph showing the approximate cost per watt vs. concentration ratio (CR) of various different concentrating photovoltaic systems. The FIG. 4 graph is based on the following assumptions. For CRs greater than 100, expensive multi-junction GaAs cells need to be used with active cooling. For CRs greater than 100, two-dimensional concentration is needed with dual-axis tracking. For CR less than 100, one-dimensional (e.g., cylindrical) concentration is used along with single-axis tracking. The cost per watt for the solar cell includes costs associated with packaging and interconnects, and the cost per watt for the concentrating optics includes costs associated with alignment. The FIG. 4 graph allows efficiency to exceed 20%. As will be appreciated from the FIG. 4 graph, a concentration ratio of about 10-30× is particularly desirable from a cost per watt perspective.

It will be appreciated that there are a number of advantages associated with certain example embodiments of this invention. For example, the 3× to 30× concentration optics may be produced easily and inexpensively using patterned glass. This may, in turn, also allow for a 3× to 30× smaller area of c-Si solar cells. Cylindrical lens arrays may be substantially self-cleaning when installed vertically at a latitude tilt in certain example implementations, as the amount of dust and/or other debris that will accumulate will be reduced, since rain will clean the grooves of the vertically positioned patterned glass lens array. Certain example embodiments also enable low cost and known, reliable assembly techniques from the FPD industry to be used in connection with strip solar cells (e.g., when they are provided with a width of about 2-20 mm). Also, as noted above, the use of low-cost single-axis tracking or lateral displacement systems may in certain example embodiments advantageously improve power output as compared to fixed orientation systems. Furthermore, many modules may be easily connected to the same single-axis tracking system. The use of such example techniques in high direct-insolation areas such as the Southwest USA may lead to higher annual energy output.

Figure 5:
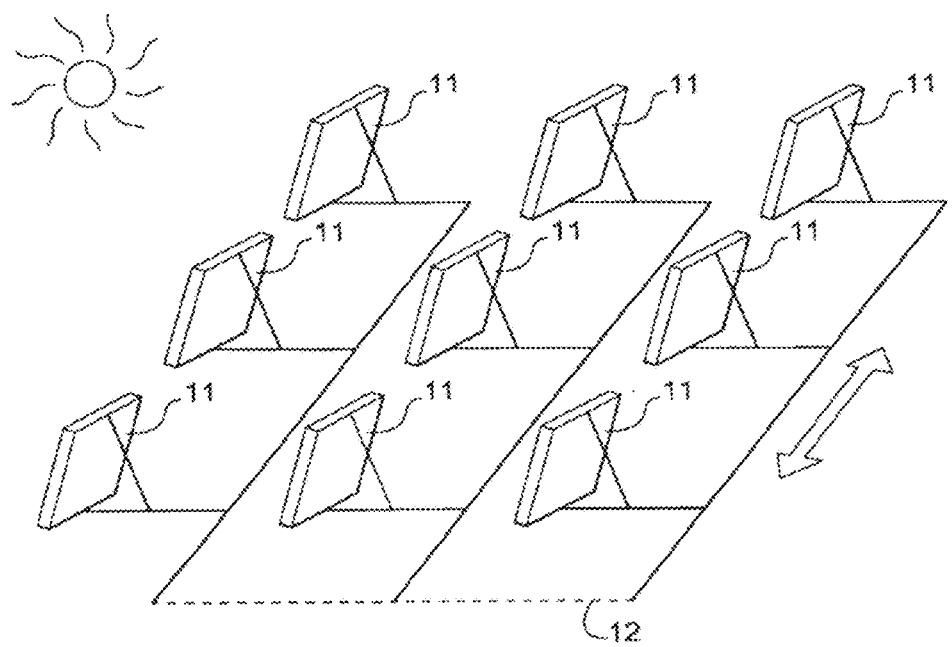
FIG. 5 is a schematic view of an illustrative one-axis tracking system incorporating concentrating lens arrays in accordance with an example embodiment.

FIG. 5 is a schematic view of an illustrative one-axis tracking system incorporating concentrating lens arrays in accordance with an example embodiment. The illustrative system in FIG. 5 includes a plurality of concentrating lens array modules 11. Each such module 11 may be the same as or similar to the arrangement shown in FIG. 1, for example. That is, each module may include a lens array that concentrates light on strip solar cells, e.g., of c-Si. The individual modules 11 may be connected to a common power source, e.g., using interconnects 12. The modules 11 also may be controlled such that they move in a direction that matches the East-West movement of the sun.

In certain example embodiments, antireflective (AR) coatings may be provided to one or both sides of the lens array to increase transmission. In certain example embodiments, a broadband AR may be provided using any suitable technique. In certain example instances, a low index silicon oxide (e.g., $SiO_2$ or other suitable stoichiometry) coating having an index of refraction of about 1.3 may be provided on one or both sides of a lens array through a wet application process (e.g., a dip, spray, roll, or other coating process), for a sol, for example. Such a technique may lead to, for example, a 3-6% increase in lens array transmission and/or module power, depending on the coating used and the number of surfaces coated.

In certain example embodiments, the lens array may be heat strengthened and/or thermally tempered. Of course, thermal tempering may be difficult to accomplish in connection with patterned glass having varying thicknesses. Chemical tempering and/or strengthening techniques therefore may be used in connection with certain example embodiments.

Figure 6:
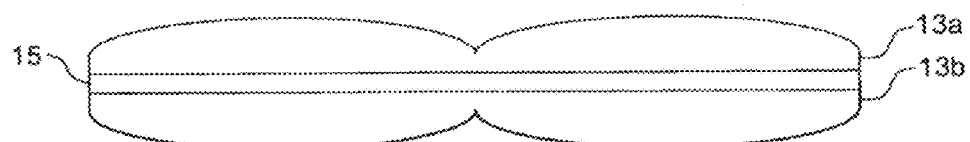
FIG. 6 is a schematic view of two plano-convex arrays being laminated together in accordance with an example embodiment.

As another alternative or addition, lens arrays may be laminated together, e.g., as shown in FIG. 6, which is a schematic view of two plano-convex arrays being laminated together in accordance with an example embodiment. In FIG. 6, first and second plano-convex arrays 13a and 13b are provided. The first and second plano-convex arrays 13a and 13b are laminated together using any suitable laminate material 15. For instance, PVB, EVA, or the like may be used to laminate together the first and second plano-convex arrays 13a and 13b. The individual arrays 13 may be individually strengthened or tempered (thermally, chemically, or otherwise) in certain example instances, as the variations in thickness may be less severe and thus easier to process in comparison to convex-convex type lens arrays. In certain example instances, the laminate 15 itself may help to strengthen the overall array.

Figure 7:
FIG. 7 is a schematic view of a Fresnel-type lens array in accordance with an example embodiment.

FIG. 7 is a schematic view of a Fresnel-type lens array in accordance with an example embodiment. As is known, Fresnel lenses generally have large apertures and short focal lengths, without the weight and volume of material that would be required in conventional lens design. In addition, Fresnel lenses tend to be thinner, thereby allowing more light to pass through them. The comparatively lower thickness variation may enable Fresnel lenses to be tempered. Although the example lens in FIG. 7 is patterned on both major axes, it will be appreciated that one side of the lens may be planar or substantially planar and the other side may be patterned. In certain example embodiments, such lenses having one planar side and one Fresnel patterned side may be laminated together, e.g., using the techniques and/or materials described above.

Figure 8:
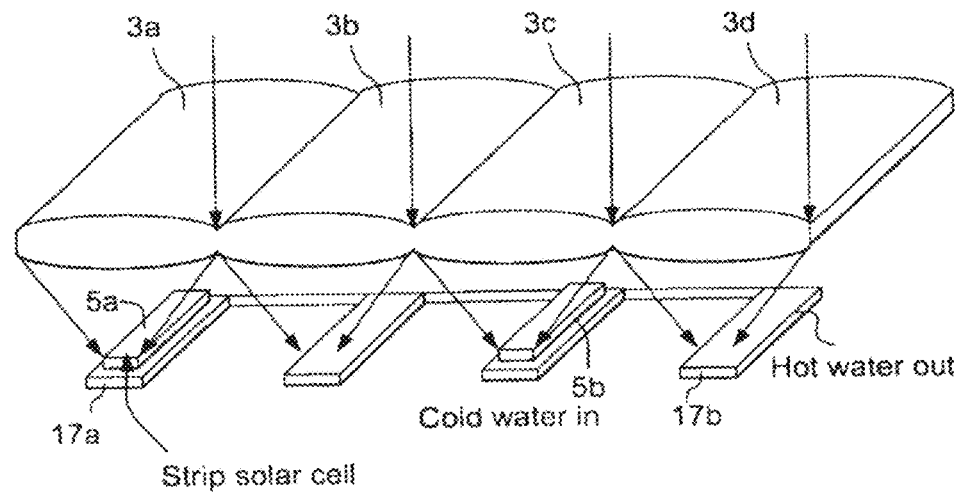
FIG. 8 is a hybrid thermal solar panel system that incorporates a lens array and strip solar cells in accordance with an example embodiment.

FIG. 8 is a hybrid thermal solar panel system that incorporates a lens array and strip solar cells in accordance with an example embodiment. The FIG. 8 example system is similar to the FIG. 1 example system in that it includes a lens array having a plurality of lenses 3a-3d, and a plurality of strip solar cells 5a-5b. Light from the sun is focused on the strip solar cells 5a-5b to produce electricity. The FIG. 5 example hybrid system also includes tubing 17a and 17b through which water or another suitable fluid may flow. Cool water is fed into the tubing 17a and 17b proximate to the strip solar cells 5a-5b, continues in a path (which in the FIG. 8 example embodiment is substantially U-shaped), and exits remote from the strip solar cell. Providing cool water proximate to the strip solar cells is advantageous in that it improves the efficiency of the c-Si. In this regard, it is known that the efficiency of c-Si solar cells drops significantly at higher temperatures (e.g., at 60 degrees C.) and improves at lower temperatures (e.g., at 25 degrees C.). The provision of cooler water proximate to the strip solar cells therefore may improve the operational efficiency of the system.

Although the presence of cooling water may increase efficiency of an individual strip solar cell, the overall solar cell efficiency may be decreased by providing fewer total solar cells, e.g., because a solar cell may not be provided along the return path for the hot output water. Nevertheless, overall efficiency may be improved by virtue of the cooling water's effect on the strip solar cells that are present and the further heating of the water via the lens array throughout the entire path, including the return path (where there is no solar cell). The heated water, of course, may be used as it otherwise would be used in connection with a thermal solar power application. As explained in greater detail below, the lens array and/or the tubing may move relative to one another, e.g., so as to match the East-West movement of the sun. This may be advantageous, for example, in building-integrated photovoltaic (BIPV) applications.

Figure 9:
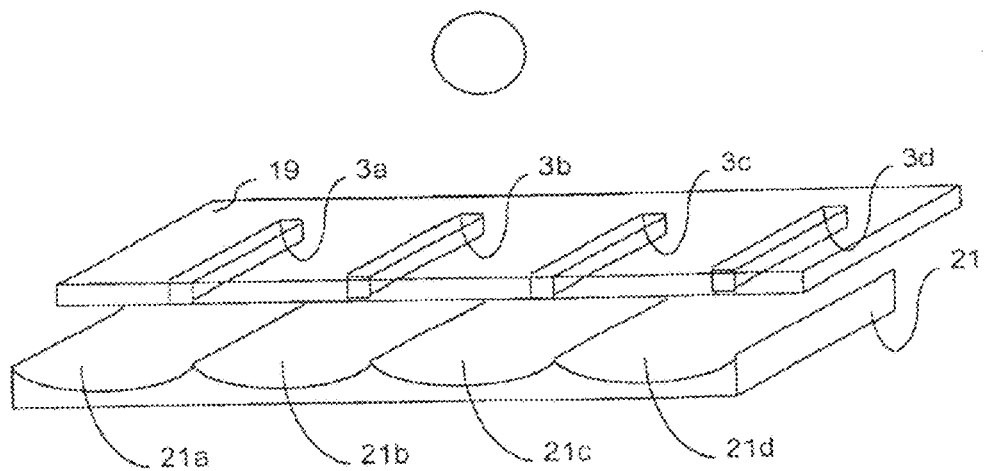
FIG. 9 is an illustrative system that incorporates a patterned mirror array and strip solar cells in accordance with an example embodiment.

Focusing additionally or alternatively may be performed using a patterned mirror array. FIG. 9 is an illustrative system that incorporates a patterned mirror array and strip solar cells in accordance with an example embodiment. In FIG. 9, strip solar cells 3a-3d are provided, directly or indirectly, on a cover glass substrate 19. For instance, the cover glass substrate 19 may be closer to the sun, and the strip solar cells 3a-3d in certain example instances may be provided on a major surface of the cover glass substrate 19 opposite the sun. In certain example embodiments, the cover glass substrate may be made from low iron float glass. In certain example embodiments, an AR coating may be applied thereto. Light passing through the cover glass substrate 19 may be reflected and concentrated back towards the strip solar cells 3a-3d using a mirror array 21. The mirror array 21 may be a piece (or multiple pieces) of patterned glass that has been coated with a reflective coating. Light impinging on the troughs or concave areas 21a-21d in the mirror array 21 therefore may be reflected back towards the strip solar cells 3a-3d. As above, relative movement of one or both of the cover glass substrate 19 and the mirror array 21 may be caused so as to improve efficiency (e.g., by tracking the East-West movement of the sun).

Although certain examples have been described in connection with a fixed or stationary solar cell module and a moving lens array, certain other example embodiments may involve a fixed or stationary lens array and a moving solar cell module. In the latter case, the lens array may be stationary at a fixed orientation, and the solar cell array may be configured to move during the day to maintain the focus of the light from the sun on the strip solar cells, e.g., to match the East-West movement of the sun. In this regard, the strip solar cells may be provided on a substrate as described above, and the substrate may be made to move. Such example embodiments may be used, for instance, in connection with building-integrated photovoltaic applications, similar to self-regulating windows. Self-regulating windows are known to dynamically adjust the amount of light passing therethrough, e.g., using diffusers, blinds, or the like. In certain example embodiments, the movement of the sun may be tracked (directly or indirectly, e.g., based on time of day and/or day of year) so that the substrate may be moved appropriately to increase or maximize the amount of sunlight impinging on the solar cells. It will be appreciated that diffuse light may be transmitted in such instances, and direct sunlight may be converted into electricity by the photovoltaic cells.

The following table compares cost per watt for various types of photovoltaic technologies.

TABLE 2

Estimated Cost per Watt for Photovoltaic Technologies Using Phoenix, Arizona as an Exemplary Location

| | Efficiency | Tracking | Annual Power Output per $m^2$ Module Area | Cost per Watt |
|---|---|---|---|---|
| Polycrystalline silicon | 15% | None | 290 kWh | $1.40 |
| Thin film CdTe (e.g., First Solar) | 11% | None | 212 kWh | $0.98 |
| Example (e.g., Lens Array) | 20% | One-Axis East-West | 505 kWh | $0.85 |

As can be seen, the example in Table 2 produces 2.4× higher output per square meter as compared to CdTe type photovoltaic systems for direct sunlight. The example in Table 2 also provides a potentially lower cost/watt compared to CdTe type photovoltaic systems.

Figure 10:
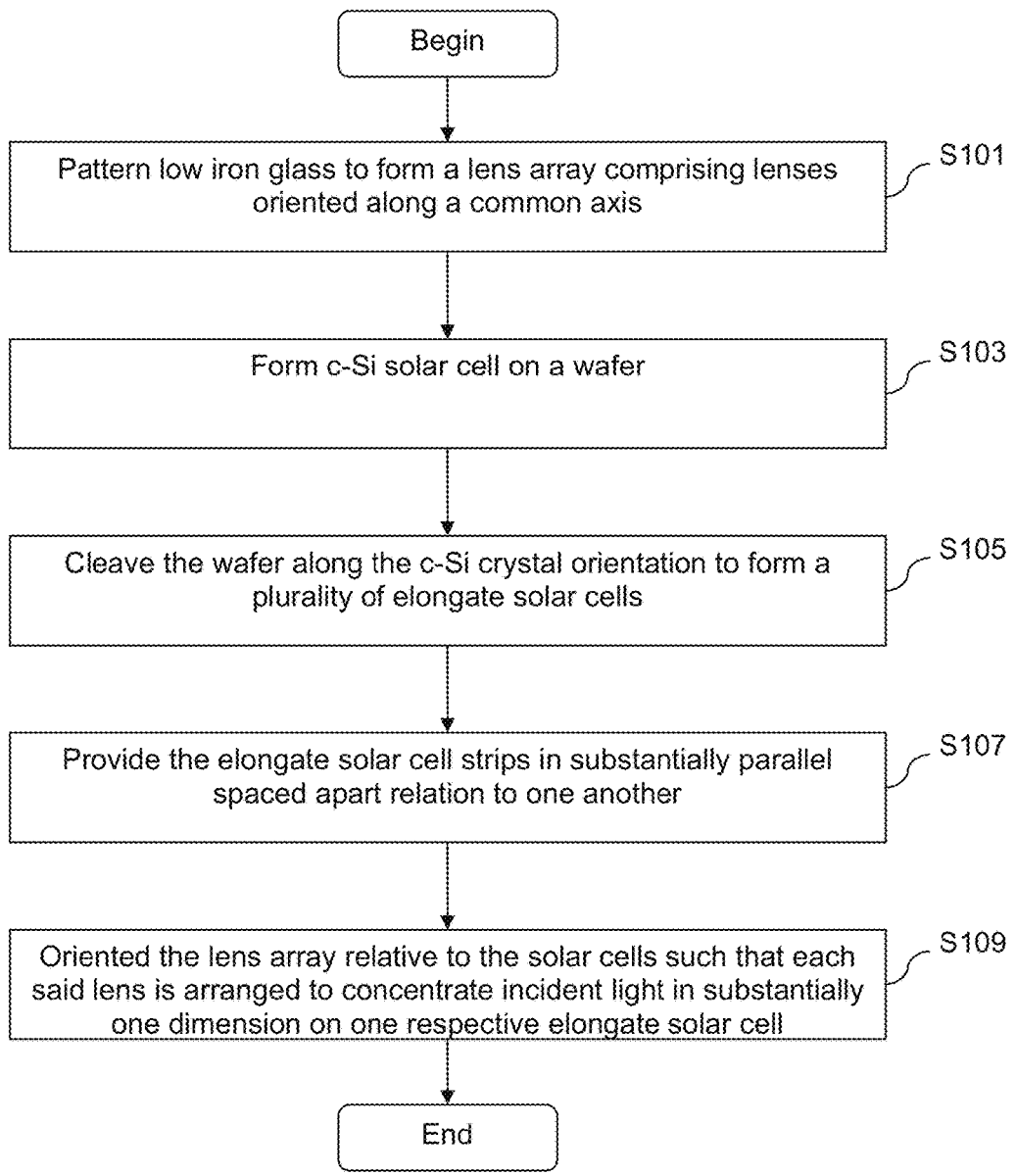
FIG. 10 is a flowchart showing an example method of making a photovoltaic system in accordance with an example embodiment.

FIG. 10 is a flowchart showing an example method of making a photovoltaic system in accordance with an example embodiment. Soda lime glass (e.g., low iron glass) is patterned, optionally using a plurality of top and bottom rollers, to form a lens array comprising a plurality of lenses oriented along a common axis in step S101. In step S103, a c-Si solar cell is formed on a wafer and, the wafer is cleaved along the c-Si crystal orientation into a plurality of elongate solar cells in step S105. The elongate solar cell strips are provided in substantially parallel spaced apart relation to one another in step S107. In step S109, the lens array is oriented relative to the solar cells such that each said lens is arranged to concentrate light incident thereon in substantially one dimension on one respective elongate solar cell. Optionally, in a step not shown, the lens array and the plurality of elongate solar cells may be mounted to a single-axis tracking or lateral displacement system, with such a system being programmed to move so as to substantially match the East-West movement of the sun, e.g., to maximize the amount of light incident on the lens array and concentrated on the strip solar cells.

Certain example embodiments may be used as windows, skylights, roof-mounted PV modules, or the like in connection with BIPV applications. For example, in rooftop applications, full size solar cells may be replaced with strip cells. The lens array may be provided in substantially parallel spaced apart relation to the strip solar cells. Known tabbing, framing, and/or junction box technology may be leveraged to help provide BIPV applications.

It will be appreciated from the description above that certain example applications may be structured somewhat similarly to insulating glass (IG) units. The first or outer pane may be the cylindrical lens array, whereas the second or inner pane may have the strip solar cells formed thereon. Rather than spacers, window frame components may help maintain the panes in substantially parallel, spaced apart relation to one another, e.g., at the appropriate focal length. In certain example embodiments, when the lens array has a flat surface, this side may face outwardly, e.g., towards the sun. Of course, providing patterned glass may be viewed as a desirable aesthetic feature in certain example instances, and a patterned surface may face outwardly in such cases.

For instance, solar panels may be produced by slicing silicon solar cell wafers into narrow strips. In certain instances, solar panel systems such as the foregoing may be advantageous in certain respects, for example, in that they may reduce the area of expensive silicon solar cells required by a factor of more than two.

As social and political pressures increase to improve efficiency and implement "green" technology, it may be desirable to implement methods and/or products that help improve the efficiency of, for example, the operation of buildings and the like (e.g., with respect to electricity usage, etc.). It will be appreciated that in certain scenarios, the efficiency of a building may be improved through different avenues. For example, photoelectric controls, solar shading, and/or glass performance may be improved and/or implemented, in order to increase operating efficiency in certain instances. Certain example photoelectric controls relate to the inclusion of controls that can improve "daylighting," e.g., by improving interior lighting through the use of natural, outside light. Solar shading, in certain instances, may include the addition of horizontal and/or vertical devices. Finally, another example technique for controlling efficiency is through glass performance—e.g., improving the solar and/or thermal properties of glass substrates and units used as windows in buildings.

Table 3 illustrates certain existing percentages by which the efficiency of certain structures may be improved through photoelectric controls, solar shading, and glass performance, from a report entitled "Driving Transformation to Energy Efficient Buildings: Policies and Actions."

TABLE 3

| High Impact Measures | Office | Retail | Hotel | Hospital | Apt | School |
| --- | --- | --- | --- | --- | --- | --- |
| Photoelectric controls | 18% | 11% | NA | 17% | NA | 10% |
| Solar shading | 17% | 11% | 18% | 18% | 8% | 2% |
| Glass performance | 15% | 6% | 16% | 14% | 11% | 5% |

Accordingly, it will be appreciated that there is an opportunity to further improve the efficiency of certain building operations, in some instances. For example, assemblies and/or methods for making these assemblies that include some degree of photoelectric control, solar shading, and improved glass performance would be desirable. The implementation of BIPV systems into existing structures and/or new construction may advantageously help further improve operating efficiency of these structures.

Unfortunately, certain existing BIPV systems have not yet been substantially commercialized (e.g., in high volume) due to several drawbacks. For example, certain existing BIPV systems are installed vertically, and do not take full advantage of the direction and/or angle of the sun, particularly in southern locations where the sun may be overhead for much of the time. Furthermore, certain existing BIPV systems may be opaque, and therefore may not allow daylight to enter the building. In some cases, when BIPV systems are partially transparent (e.g., do allow some daylight to enter the building), it is usually at the expense of PV efficiency and electricity output. Additionally, certain existing BIPV systems may not substantially provide thermal insulation, and/or may fail to provide solar heat gain control. Thus, it will be appreciated by one skilled in the art that there is a need for an improved BIPV system that overcomes the foregoing shortcomings.

Certain example embodiments described herein relate to improved BIPV systems (e.g., building integrated photovoltaics), and methods of making the same. Certain example embodiments of the assemblies described herein may include photovoltaic skylights, windows, windshields, sunroofs for automobiles, and/or other photovoltaic applications. The assemblies described herein may include dual or triple glazing units in certain example embodiments. Assemblies including example improved BIPV systems may be installed in existing roof and/or façade areas in certain example instances. Of course, certain assemblies described herein may also be installed during new construction. In certain example embodiments, assemblies including improved BIPV systems may replace existing building materials with a potentially more cost-effective system.

In certain example embodiments, assemblies as described herein may advantageously (1) be installed at a latitude tilt, such that they face the equator, in order to increase the amount of direct sunlight incident upon the lenticular array; (2) permit diffuse daylight entry into a structure, while utilizing most or substantially all of the direct sunlight for the solar cells; (3) provide self-regulating or dynamic solar heat control, including a lower Solar Heat Gain Coefficient when necessary; and/or (4) provide improved thermal insulation. Furthermore, a photovoltaic skylight may permit diffuse daylight to pass through into an interior of a building so as to provide lighting inside the building, while the strip solar cells absorb the direct sunlight and convert it to electricity.

Figure 11:
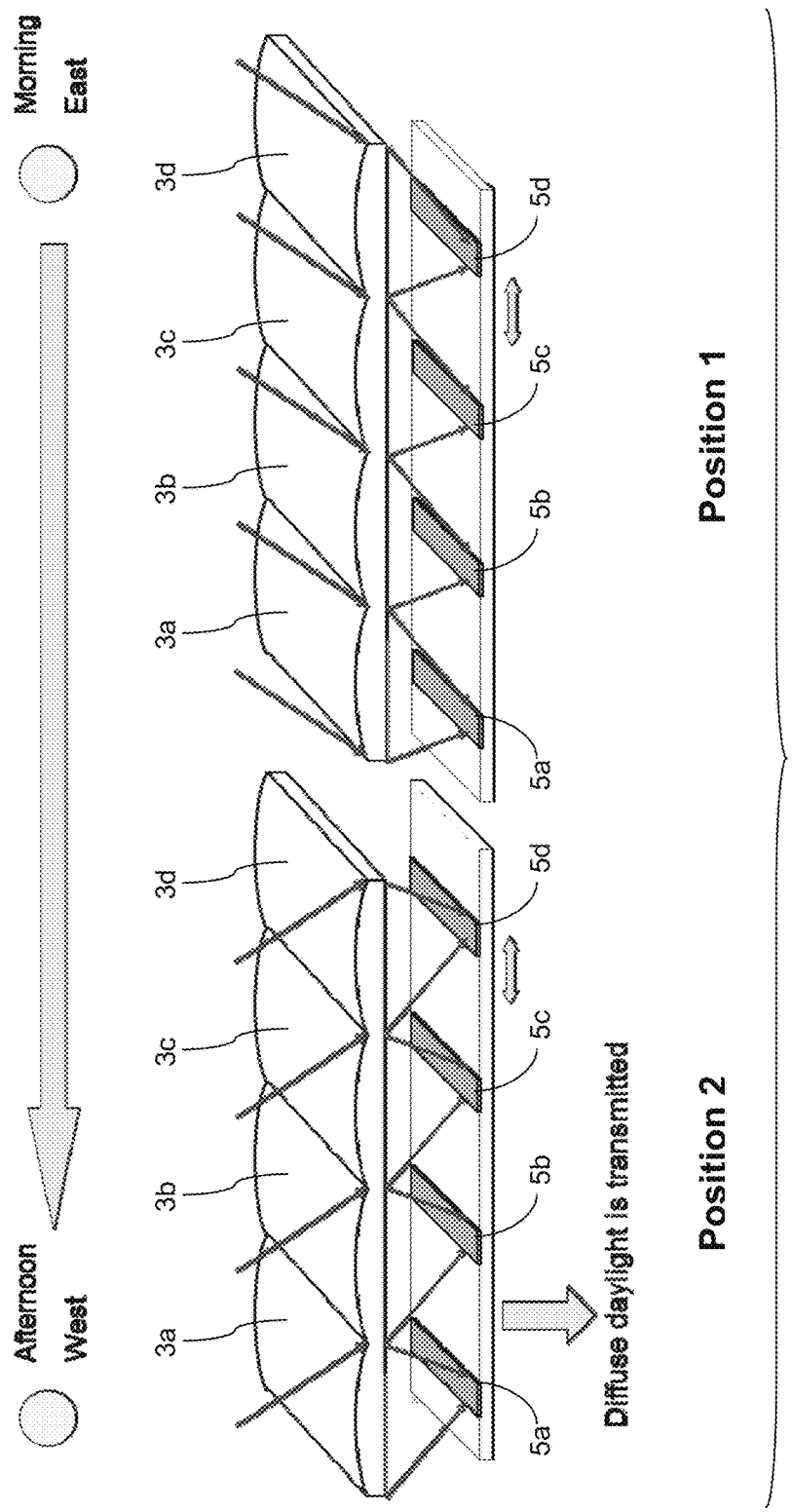
FIG. 11 illustrates a perspective view of a photovoltaic skylight comprising strip solar cells capable of lateral movement based on the position of the sun, according to certain example embodiments.

FIG. 11 illustrates a perspective view of an assembly according to certain example embodiments. The assembly of FIG. 11 may be a photovoltaic skylight, in certain example embodiments. The assembly of FIG. 11 may comprise a lenticular array (e.g., lens array, cylindrical lens array, etc.) and a substrate supporting solar cells, arranged together in a frame or the like to form a double glazing unit. The assembly may be disposed on a building, roof, façade, etc., such that sunlight will be incident upon and concentrated by the lens array. The light then may be focused upon the solar cells. As can be seen from FIG. 11, the cylindrical lens array may include plural lenses $3a$-$3d$ that focus the light on the strip solar cells $5a$-$5d$, respectively. As described in greater detail below, the lens array and/or the strip solar cells may move relative to one another, e.g., from position 1 to position 2 (and intermediate points), to account for the sun's movement in the sky (e.g., from east in the morning to west in the afternoon).

Figure 12:
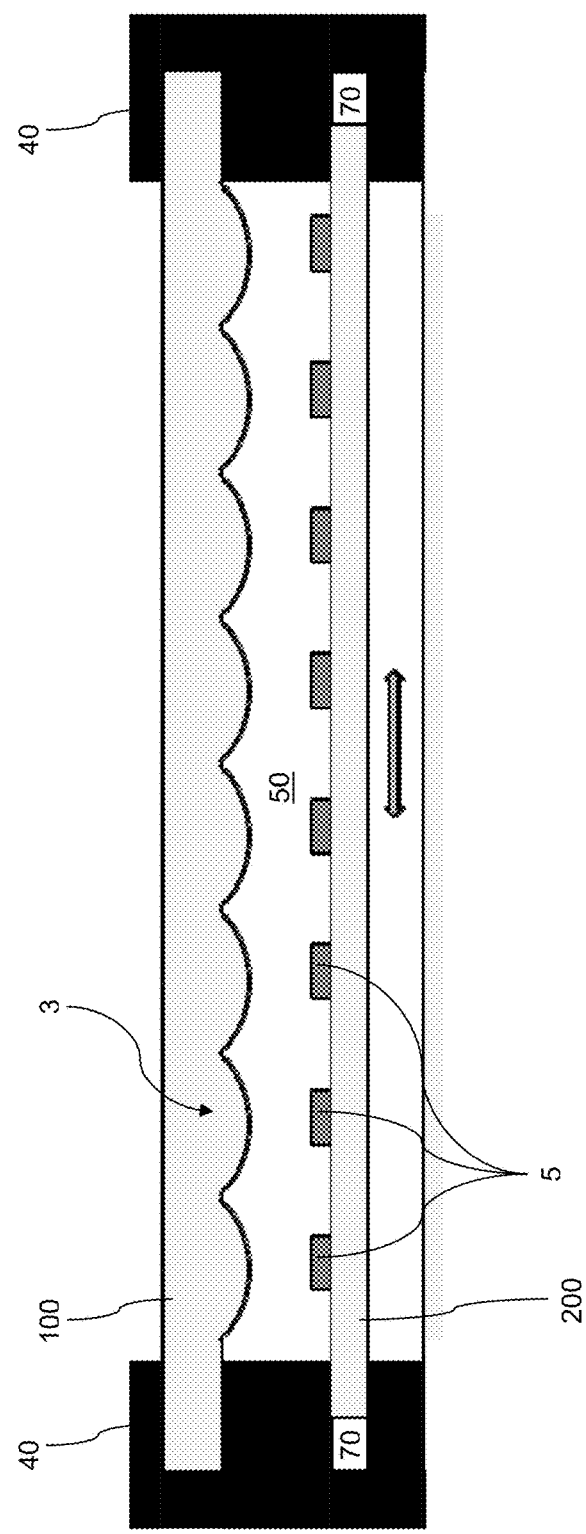
FIG. 12 is an example cross-sectional view of a dual glazing insulated glass photovoltaic skylight system in accordance with certain example embodiments.

FIG. 12 is an example cross-sectional view of a dual glazing insulated glass photovoltaic skylight system 75 in accordance with certain example embodiments. In FIG. 12, first substrate 100 comprises a lenticular array 3, and solar cells 5 are disposed on second glass substrate 200. Substrates 100 and 200 are separated by air gap 50. Together, substrates 100 and 200 form a dual glazing unit. FIG. 12 further illustrates slide mechanism 40. Slide mechanism 40 may be included in certain example embodiments to assist with lateral movement of the solar cells and/or substrate 200, e.g., relative to one another. Furthermore, an optional low-E coating 4 may be disposed on an interior surface of assembly 75 in FIG. 12. Low-E coatings may be included in assembly 75 in certain example embodiments; e.g. on an interior surface of a substrate in the assembly. Although not expressly shown, a low-e coating may be disposed on one or more surfaces of any substrates in an assembly 75 according to any example embodiment. Furthermore, anti-reflection coatings may also be provided on one or more surfaces of any of the substrates.

Figure 13:
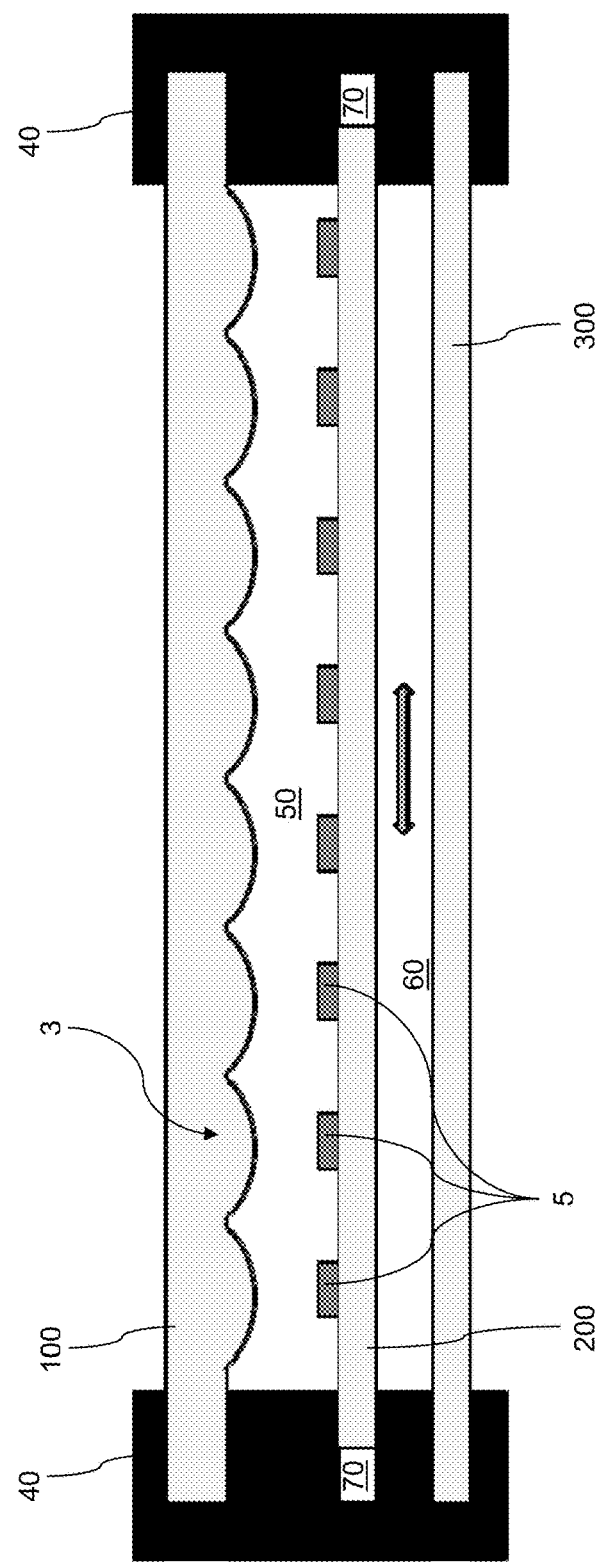
FIG. 13 illustrates an example embodiment of a triple glazing insulated glass photovoltaic skylight system in accordance with certain example embodiments.
Figure 14A:
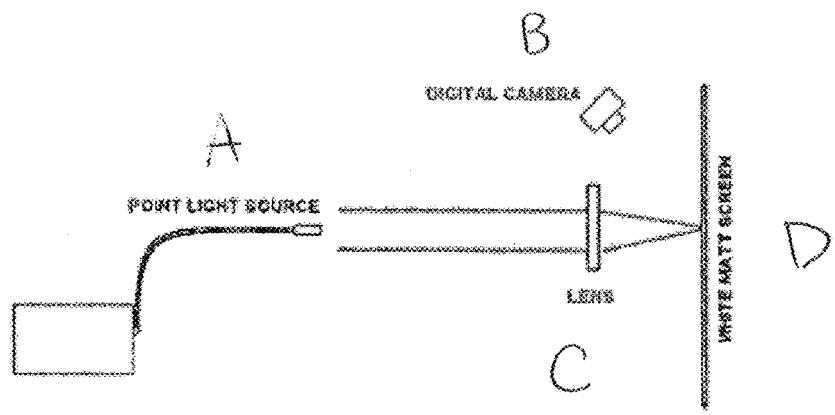
FIGS. 14(a)-(d) illustrate how measurements can be taken from reference cylindrical lens(es)
Figure 14B:
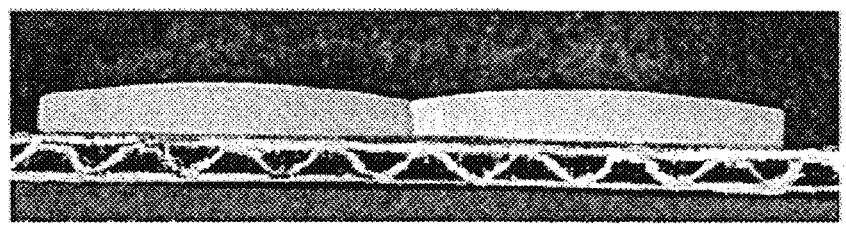
Figure 14C:
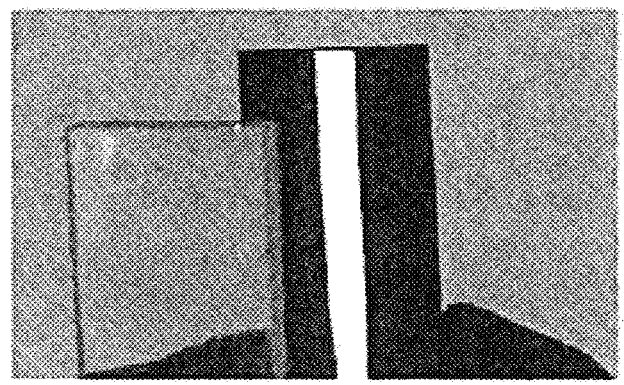
Figure 14D:
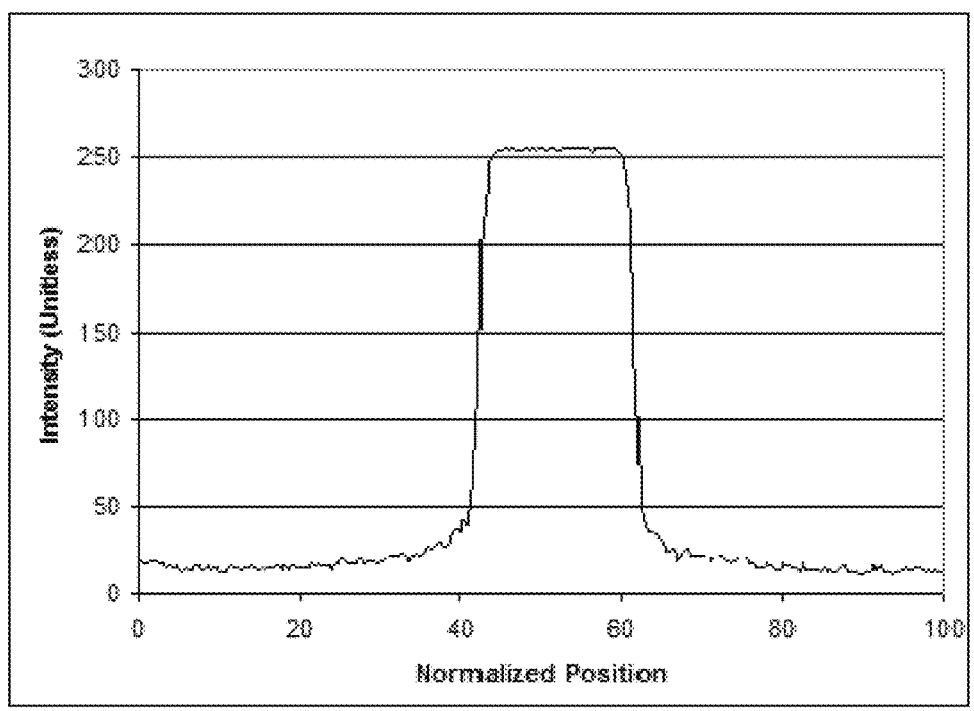

If certain example embodiments, the assembly may include an additional (e.g., third, or even further) glass substrate, and may be a triple (or other) glazing unit. FIG. 13 illustrates an example embodiment of a triple glazing BIPV system in accordance with certain example embodiments. In FIG. 13, lenticular array 100, and substrate 200 supporting strip solar cells 5, are arranged in an insulating unit in connection with a frame 40, with an air gap 50 between the first and second substrates. Substrate 200 is capable of lateral movement as shown by pockets 70. In addition, in example triple glazing embodiments, a third substrate 300 is provided on the opposite side of substrate 200 as substrate 100, creating a second air gap 60 between substrates 200 and 300. In certain example embodiments, substrate 300 may be any suitable glass substrate. Although not shown in FIG. 13, a low-e coating may be disposed on one or more surfaces of any substrates in an assembly 75 according to any example embodiment. Interior surfaces 2, 4, and 5 may be desirable locations for such a coating, as they may protect the functional layer(s) of the low-E coatings or the like. Furthermore, anti-reflection coatings may also be provided on one or more surfaces of any of the substrates.

Because of the (at least) double glazing nature of certain example embodiments of the assembly, some degree of thermal insulation may result, in certain example instances. In addition, the air gap provided between the first and second and/or second and third substrates may be substantially evacuated and/or filled with an inert gas (e.g., Ar, N, Xe, and/or the like) in order in forming an insulated glass unit. This may further improve thermal insulation in certain examples. It will be appreciated that in certain example embodiments, a triple glazing assembly may advantageously provide an even greater degree of thermal insulation than similar dual glazing systems when implemented as a window and/or skylight. However, in other example cases the air gap may simply include air.

In certain examples, the assemblies of FIGS. 11, 12, and/or 13 may be integrated into a roof or cover-like structure of a building, car parking structure (e.g. to recharge electric cars or sunroofs of electric cars to recharge their batteries), etc. In certain instances, the assemblies of FIGS. 11, 12, and/or 13 may be installed at a latitude tilt, such that they face the equator, and increase the amount of direct sunlight incident upon the lens array. In case the module is mounted as the sunroof of a moving or parked vehicle, a photosensor may control the lateral displacement of the PV array with respect to the lens array, since the direction of solar incidence would depend on the direction in which the vehicle is moving or parked.

During the course of the day, the sun moves from the east to the west. In certain example embodiments, the glass substrate supporting the strip solar cells illustrated in FIGS. 11, 12, and/or 13 may move from left to right in the figure; relative to the lenticular array. In other words, in certain example embodiments, the overall assembly may remain in a fixed or substantially fixed position with respect to the surface upon which it has been installed, while the substrate supporting the strip solar cells moves laterally with respect to the lenticular array, and within the fixed or substantially fixed assembly. In certain instances, this may maintain the focus of the light substantially directly on the solar cells.

It will be appreciated that this type of movement (e.g., part of the unit remaining substantially fixed while another aspect of the unit moves with respect to the fixed aspect) may be different from other one axis tracking systems. For example, in other cases, the position of the solar cells may be fixed with respect to the lens array, and the sun may be tracked by using one axis tracking, or even two axis tracking, in some situations. However, as explained above, the implementation of system tracking by moving the solar cells substantially laterally, relative to the lenticular array may replace one or two axis tracking.

In certain example embodiments, tracking by moving the solar cells laterally relative to the lens array may be more advantageous than situations in which the position of the solar cells is fixed with respect to the lens array. For example, this may enable the assembly to be more easily integrated into existing structures and/or new construction. In certain cases, this may enable the overall assembly to remain substantially stationary within the building, roof, façade, or the like (e.g., the only movement occurs within a substantially fixed frame and/or the like); while still permitting the sunlight to remain focused on the solar cell strips throughout the course of the day, as described above.

As a result of this relative shift of the solar cells with respect to the lenticular array, the solar cells may continue to generate electricity while partially or substantially blocking direct solar radiation from entering the building, thereby reducing glare. This may provide self-regulating solar heat control, in certain example embodiments. For example, when the assembly is exposed to an uncovered sun, in full daylight, the solar cells may absorb substantially all of the direct light, and consequently block direct solar radiation from entering the building. Thus, the Solar Heat Gain Coefficient of certain example assemblies may advantageously be lowered during situations where this would be desirable.

On the other hand, diffuse light (e.g., light not directly from the sun, but nonetheless incident upon the glass surface), may not be focused on the solar cell strips, and may pass between the solar cells, in certain example embodiments. The diffuse light entering the building may advantageously provide lighting therein. In certain example embodiments, the diffuse lighting may be provided in the building and/or structure without significantly impacting (e.g., decreasing) the photovoltaic efficiency and/or electricity output. Furthermore, the increase in diffuse light entry may also advantageously reduce the need for artificial lighting, in certain example embodiments.

Turning more particularly to the structure(s) and advantages relating to the example improved BIPV systems described above, in certain instances these assemblies may include a lens array (e.g., cylindrical lens array (CLA), lenticular array, etc.) and a substrate supporting solar cells, the substrate being capable of lateral movement, in certain example embodiments.

Direct solar radiation focused by a lenticular array on the strip solar cells is shown in FIG. 11. For example, a concentration ratio of the lenticular array may be from about 1.5× to 30×, more preferably from about 2× to 20×, and most preferably from about 3× to 10×, and all subranges therebetween.

Certain example CLAs have been described herein, e.g., in connection with FIG. 3. Lens arrays are used in the optics industry and the display industry, for example. In certain instances, CLAs may be used in three dimensional (3D) displays. As indicated previously, CLAs may be plano-convex lenses in certain examples. However, CLAs may also be convex-convex lenses. As indicated above, the CLA illustrated in FIG. 3 is an example plano-convex lens array. For example, in the case of a plano-convex lens array, the focal length may be similar for collimated light entering from the planar side and the convex side. As also indicated above, the lens array dimensions provided therein are for purposes of example. In certain cases, the lens design may depend, at least in part, on the feasible glass thickness variation (e.g., a maximum amount by which the thickness of the glass can vary throughout the substrate), and the width of the solar cells (e.g., the aspect ratio, etc., of the strip solar cells).

In a triple insulating glass unit embodiment, a low-E coating may be provided on surface 4 and/or surface 5. One or more surfaces (e.g., of the middle substrate) may be etched to help promote diffusion of light through the unit. AR coatings also may be used. Example low-E and AR coatings, and their configurations, are set forth in U.S. Publication No. 2013/0149473, the entire contents of which are hereby incorporated herein by reference. Additional example low-E coatings are set forth below, and additional example AR coatings include those disclosed in U.S. Pat. No. 7,767,253, as well as U.S. Publication Nos. 2013/0196140; 2013/0196139; 2012/0057236; 2011/0157703, 2009/0133748, 2009/0101209, 2009/0032098, and 2009/0025777. The entire contents of each of these documents is hereby incorporated herein by reference. Using Phoenix Ariz. as an example, such a unit would be expected to produce 175-750 kWh/m$^2$/year, more preferably 225-500 kWh/m$^2$/year, with an example energy production being 258 kWh/m$^2$/year. In certain example embodiments, under direct sun light, the Solar Heat Gain Coefficient (SHGC) preferably is less than 0.40, more preferably less than 0.20, still more preferably less than 0.15, and sometimes 0.12 or lower. By contrast, in cloudy conditions, SHGC preferably is less than 0.80, more preferably less than 0.65, and sometimes about 0.5 or lower. Of course, higher or lower values may be provided in different climates and/or geographic regions. The U-value of the assembly when both low-E and AR coatings are provided may be less than 0.5, more preferably less than 0.35, and sometimes about 0.2. Visible transmission in such circumstances may be about 50%, although higher or lower values may be provided based on the desired application.

FIGS. 14(*a*)-(*d*) illustrate how measurements can be taken from reference cylindrical lens(es). For example, FIG. 14(*a*) illustrates a reference cylindrical lens C. A point light source A is directed towards the white matte screen D through the lens C, and a digital camera B records the image produced on a white matte screen D. FIG. 14(*b*) shows a cross sectional view of a cylindrical lens from Edmund Optics, e.g., of the sort that may be used as lens A in FIG. 14(*a*). FIG. 14(*c*) is an example image taken by the camera. The narrow white band is illustrative of concentrated light. FIG. 14(*d*) is a graph plotting the (unitless) light intensity versus normalized position for the example cylindrical lens. The FIG. 14(*d*) graph helps demonstrate that in certain example embodiments, cylindrical lens arrays (e.g., of or including patterned glass) may have more than 90% focusing efficiency. In certain example embodiments, a patterned glass CLA may have a focusing efficiency of at least about 70%, more preferably at least about 80%, and most preferably about 90%, in certain example embodiments.

It will be appreciated that the lens arrays disclosed herein may include glass, plastics, and/or other suitable materials.

As described herein, the lenticular array may focus and/or concentrate the incident light into a small area, and this concentrated light may be transmitted through the array and be incident upon one or more solar cells. The solar cells may be lined up such that their location substantially corresponds to the size, shape, and/or position of the concentrated light transmitted through the lenticular array. In this regard, the smaller the area into which the light can be concentrated, the narrower the solar cell may be, in certain instances. Narrower strip solar cells may advantageously permit more diffuse light to pass through the lenticular array and substrate supporting the solar cells, into an interior of the building upon which the assembly is disposed, in certain example embodiments.

Lens arrays for concentrated photovoltaics (CPV) may be cost-effectively manufactured in several ways, including, for example, by patterning glass as described in co-owned and commonly assigned U.S. Publication Nos. 2011/0259394 and 2011/0263066, both incorporated herein by reference. In certain examples, the glass may be of or include low iron glass. In further example embodiments, lenticular arrays for CPV applications may be made by laminating a plastic, molded, lenticular array (for example, made from PMMA) to a glass substrate (e.g., a low iron glass substrate). In this case, the lens array is in an interior position, while the glass substrate protects it from the elements outside.

Figure 15A:
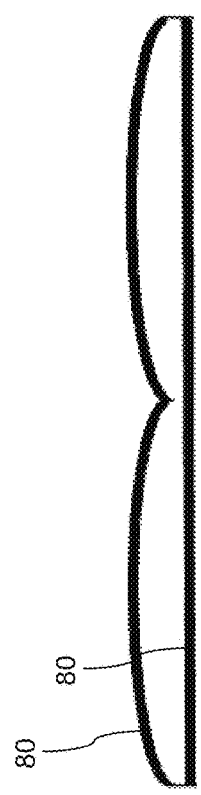
FIGS. 15(a)-(c) illustrate an AR coating disposed on a lenticular array according to certain example embodiments.
Figure 15B:
Figure 15C:

In certain example embodiments, an anti-reflection coating may be disposed on a surface of a lenticular array. FIGS. 15(*a*)-(*c*) demonstrate how one or more AR coatings may be disposed on a lenticular array. More particularly, FIGS. 15(*a*)-(*c*) show that the AR coating 80 may be single or double sided (e.g., as in FIGS. 15(*b*)-(*c*) and FIG. 15(*a*), respectively), in certain example embodiments, and may be provided on either the first or second surface of the lenticular array (or both, of course). In certain example embodiments, a two-sided AR coating may cause up to a 6% increase in lens array transmission and/or photovoltaic output. Similarly, a single-sided AR coating may permit an increase in transmission and/or output of up to about 3%. Suitable AR coatings are described in, for example, U.S. Publication Nos. 2012/0196133; 2011/0157703; and 2012/0057236. In certain example embodiments, the solar cells may be of or include any suitable material. However, in certain example embodiments, the solar cells may be silicon strip solar cells. Certain silicon strip solar cells have been commercialized by Solaria in 2×CPV panels. In those instances, the solar cell strips may be directly mounted on the back of the lenticular array.

In some cases, solar cell strips may be directed attached to the back of the cylindrical lens array, effectively requiring single axis tracking. See, for example, U.S. Pat. No. 8,119,902, as well as U.S. Publication Nos. 2012/0067397, 2011/0315196, 2011/0186107, 2011/0168232, 2010/0294338, 2009/0056788, 2008/0289689, which show these and/or other associated designs.

Slim chip technology and packaging have been used in some instances for driver chips in the flat panel display industry. In certain example embodiments, elongated silicon strips with a relatively high aspect ratio may be utilized. For example, the aspect ratio (e.g., length to width) may be about 10:1, more preferably about 15:1, and most preferably about 20:1 (e.g., 10 mm×1 mm, 20 m×2 mm, 15 mm×1 mm, 20 mm×1 mm, etc.), but in certain instances it may be even greater. For example, in certain example embodiments, driver ICs for LCDs (e.g., in the flat panel display industry) may have a length greater than 30 mm long and a width of less than 1.5 mm. These strips may be directly or indirectly mounted on glass with low cost Chip on Glass (COG) technology, in certain examples.

Solar cells with only back contacts (e.g., from Sunpower), may be preferred in certain examples, to avoid shading effects. Furthermore, in certain example embodiments, solar cells having only back contacts may be mounted directly on a glass substrate with a low-cost COG technology. However, in other example embodiments, the solar cells may have front and/or back contacts.

Furthermore, certain example methods of wafer slicing that may be used on certain solar cells may advantageously lead to lower cost strip solar cells with lengths up to 6 or 8 inches (and in some cases even longer), in certain cases. These wafer slicing techniques may advantageously be used, in particular, on high efficiency back contact solar cells, in certain example embodiments. In certain example embodiments, wafer slicing techniques used on high efficiency back contact solar cells (e.g., manufactured by Sunpower), may lead to ultralow cost (e.g., on the order of cents) strip solar cells with a length up to, for example, 6 or 8 inch wafer dimensions (e.g., 150 to 210 mm).

Thus, it will be appreciated from the foregoing that elongated silicon strips with relatively high aspect ratios may be attached directly or indirectly to glass substrates at a relatively low cost.

Additionally, certain example assemblies described herein may advantageously differ from other commercialized solar strips. For instance, in certain example embodiments of the instant invention, the lenticular array and substrate supporting the solar cells may be disposed in a frame such that an insulating glass unit may be formed. In certain instances, an air gap may be provided between the first glass substrate (e.g., the lenticular array), and the second glass substrate with the solar cells. In certain instances, the substrates are spaced farther apart to form the air gap. As a result of the increased distance between the lenticular array and the solar cells, higher concentration ratios may be possible (e.g., from about 2× to 20×, preferably from about 3× to 10× and all sub-ranges therebetween). This increase in concentration of the light, and consequent reduction in size of the "beam" of light, may advantageously reduce the necessary width of the silicon solar cells, in certain cases. Such a reduction in area may also further reduce costs associated with the solar cells (e.g., since a smaller area of solar cells may consequently reduce the amount of solar cell material needed).

As described above, the substrate supporting the solar cells may be configured for lateral movement within the assembly. In other words, certain example embodiments of assemblies described herein may advantageously include a lateral movement mechanism for only the lower substrate, e.g. the substrate supporting the solar cells. In that regard, the lens array and substrate supporting the solar cells may be supported together in a frame, and in certain instances the frame may be provided such that it permits lateral movement of the substrate supporting the solar cells.

Certain example embodiments may advantageously permit the solar cells (e.g. strip solar cells) to remain substantially in line with the "beam" of light focused by the lenticular array, as the sun's position in the sky changes throughout the day, without the need for more conventional one or two axis tracking systems. This lateral movement capability may in certain example embodiments advantageously enable an assembly to be installed in and/integrated with a building, structure, and/or the like, in a fixed manner, such that the assembly, overall, remains substantially stationary (e.g., permitting better seals, less cumbersome frames, etc.). This lateral movement may be used instead of one or two axis tracking, in certain example embodiments.

For example, in order to maintain the focus of direct sunlight on the solar cell strips, in certain example embodiments, the second glass substrate (e.g., the substrate upon which the solar cells are disposed) may be made to move throughout the course of the day. This movement may be on the order of a cm to an inch, in certain implementations. Referring once again to FIGS. 12 and 13, it is noted that the solar cell substrate (200) may be mounted on a low friction hinge mechanism or slide or rail mechanism, mounted in a frame with the lenticular array and/or lenticular array and substrate (100), etc., to facilitate such movements. This is illustrated as element 40 in FIGS. 12 and 13, described above. A hinge mechanism similar to that used in shower doors that enables the parts to move with respect to one another with low friction may be used, for example. The slide mechanism on rails may be similar to that used in drawers.

In certain examples, small, low cost linear motors and/or actuators may be available to control the lateral movement of the glass substrate with the solar cell strips. The motors and/or actuators may be miniature, in certain instances. Miniature linear actuators in some cases may be operated by small stepper motors. Small linear motors/actuators may also be used in low cost consumer electronics, automotive, and industrial applications. However, it will be appreciated that the lateral movement of substrate 200 may be controlled in any suitable manner.

Linear motors and/or actuators may be built into the frame of the assembly, in certain example embodiments. These motors and/or actuators may be controlled, in certain examples, by low cost microcontrollers. The controllers may be programmed to maintain relative orientation between a lenticular array and a glass substrate with solar strips disposed thereon, in order to maintain the focus of the sunlight, in certain examples.

This movement preferably is a low friction movement. Thus, the movement may require very little power. For example, in certain embodiments, a lateral movement step of from about 0.01 to 1 mm every 10 minutes is all that may be necessary to maintain the focus of the sunlight. Furthermore, the force requirement to move the glass may be low, particularly if the glass substrate is relatively thin (e.g., less than about 10 mm, more preferably less than about 5 mm, and most preferably from about 1 to 2 mm). In certain instances, the glass may be thick enough to reduce bowing, but thin enough to reduce weight. In some cases, power generated by the solar cells may be used to power this movement.

The dual and/or triple glazing assemblies described herein may not suffer from at least some of the problems experienced by traditional concentrated photovoltaic system. In certain conventional concentrated photovoltaic systems (e.g., those installed in the desert or the like), a rugged, robust, and expensive tracker system may be needed in order for the system to withstand windloads, other external forces, and certain acts of nature. However, in certain example embodiments of the assemblies disclosed herein, there may be no or few heavy external forces impacting the tracker system (e.g., wind, etc.). This is because the glass with the solar strips may be safely enclosed between the lenticular array and the inside of a building (e.g., in the case of a dual glazing unit), or even between a first and third glass substrate (e.g., in the case of a triple glazing unit, or a unit with even more substrates). It will be appreciated that the improved durability resulting from the double, triple, quad, etc., glazing is advantageous, and makes the assemblies described herein desirable for implementation into energy-efficient buildings.

Figure 16:
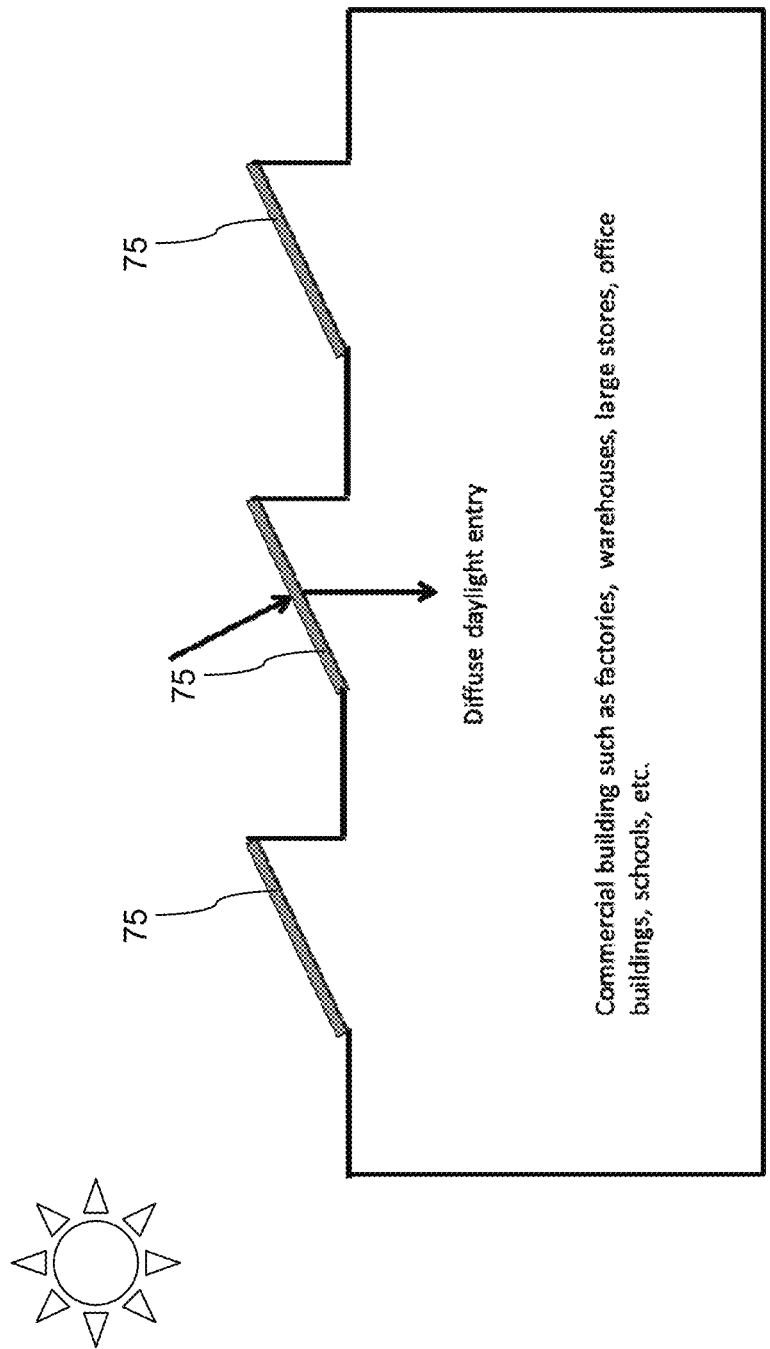
FIG. 16 illustrates certain example photovoltaic skylights installed at a latitude tilt, facing the equator.
Figure 17C:
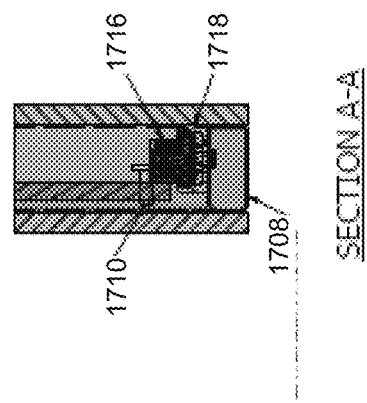
Figure 17A:
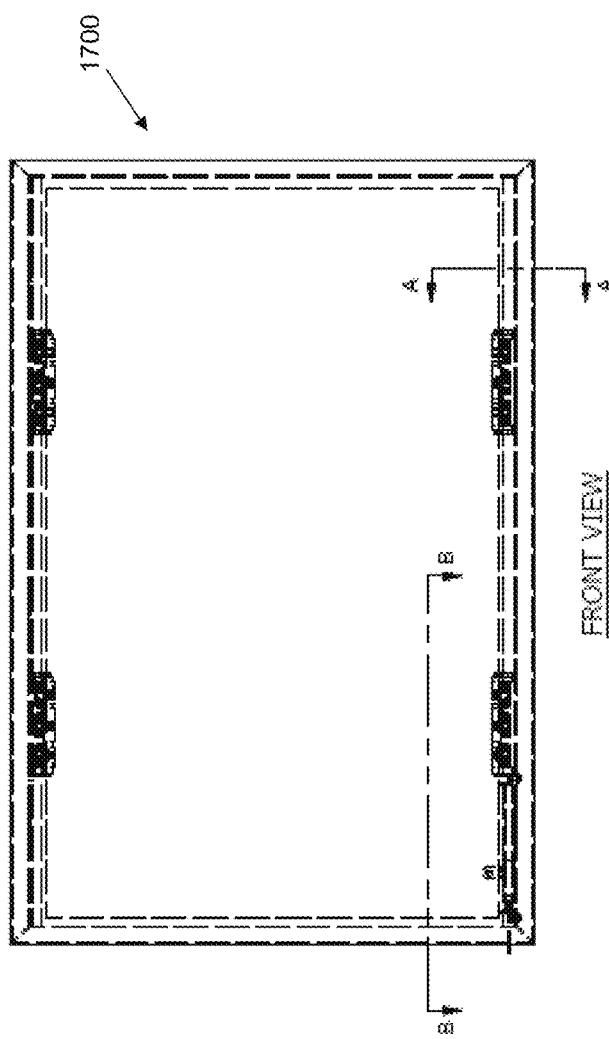
Figure 17E:
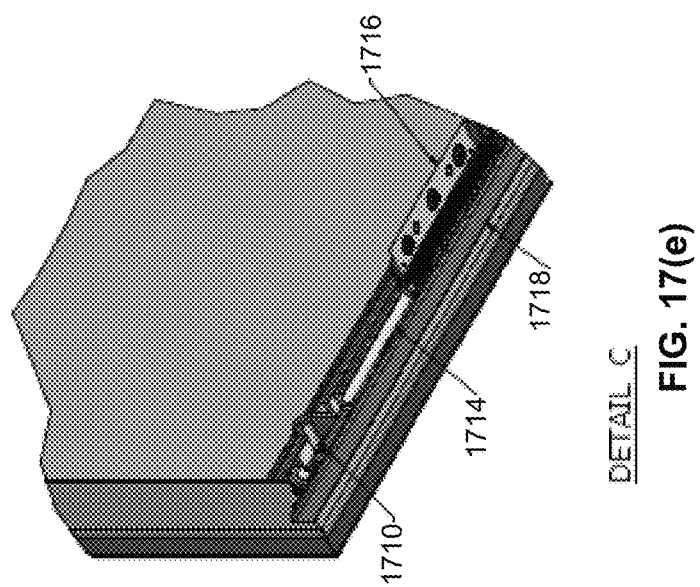
Figure 17B:
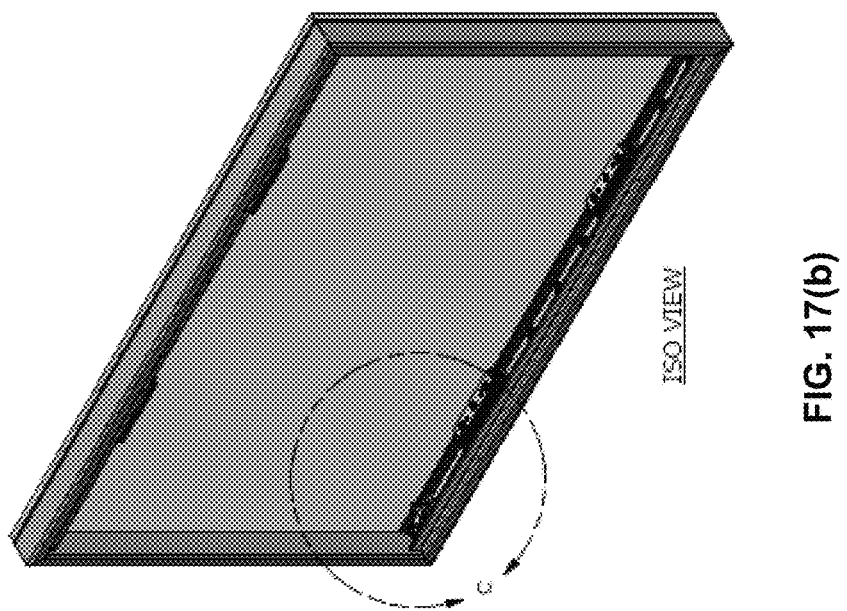

Certain example assemblies disclosed herein may be installed at a latitude tilt as shown in FIG. 16, on the roof of buildings. The assemblies may be thermally insulating in certain example embodiments. Furthermore, the assemblies may advantageously have a low Solar Heat Gain Coefficient for direct sunlight. Additionally, in certain examples, the diffuse light/daylight that enters a building through the assembly may reduce the need for artificial lighting. In view of these features, the cost of heating and cooling the building may advantageously be kept low.

In certain example embodiments, the installation of an example assembly may be particularly advantageous in southern locations (in the northern hemisphere), locations near the equator, and in northern locations in the southern hemisphere (though one skilled in the art will understand the modifications to this system if implemented in locations other than the northern hemisphere). In certain instances, installing an assembly at a latitude tilt, facing the equator, may advantageously give more annual energy output than a vertical façade system. In other words, the assemblies described herein may be particularly advantageous in warmer climates, e.g., with an abundance of direct sunlight. However, the applicability of these assemblies is widespread and they may be used in any climate or region.

The table below shows example energy output data for Phoenix, at a 33.43 degree latitude. The calculations in Table 4 were calculated using the NREL PVWatts calculator.

TABLE 4

Simulated Results of Installation at Latitude Tilt v. Vertical Installation

| | Results at Latitude Tilt | | | Results of Vertical Installation | | |
|---|---|---|---|---|---|---|
| Month | Solar Radiation kWh/m2/day | AC Energy (kWh) | Energy Value ($) | Solar Radiation kWh/m2/day | AC Energy (kWh) | Energy Value ($) |
| 1 | 5.09 | 451 | 38.34 | 4.79 | 427 | 36.30 |
| 2 | 6.05 | 486 | 41.31 | 5.04 | 408 | 34.68 |
| 3 | 6.61 | 566 | 48.11 | 4.38 | 363 | 30.86 |
| 4 | 7.54 | 613 | 52.11 | 3.72 | 273 | 23.21 |
| 5 | 7.54 | 619 | 52.62 | 2.70 | 178 | 15.13 |
| 6 | 7.28 | 559 | 47.52 | 2.26 | 132 | 11.22 |
| 7 | 7.14 | 569 | 48.37 | 2.47 | 156 | 13.26 |
| 8 | 7.17 | 576 | 48.96 | 3.17 | 220 | 18.70 |
| 9 | 7.15 | 557 | 47.34 | 4.31 | 318 | 27.03 |
| 10 | 6.75 | 565 | 48.02 | 5.33 | 447 | 37.99 |
| 11 | 5.59 | 469 | 39.87 | 5.14 | 435 | 36.98 |
| 12 | 4.88 | 438 | 37.23 | 4.85 | 437 | 37.15 |
| Year Total | 6.57 | 6468 | 549.78 | 4.01 | 3794 | 322.49 |

TABLE 5

| Station Identification | |
|---|---|
| Station Identification | |
| City: | Phoenix |
| State: | Arizona |
| Latitude: | 33.43° N |
| Longitude: | 112.02° W |
| Elevation: | 339 m |
| PV System Specifications | |
| DC rating: | 4.0 kW |
| DC to AC Derate Factor: | 0.77 |
| AC Rating: | 3.1 kW |
| Array Tilt: | 33.4° or 90° |
| Array Azimuth: | 180.0° |
| Energy Specifications | |
| Cost of Electricity: | $0.085/kWh |

The 4 kW system of Table 5 uses about 25-50 m² of (BIPV) skylight area if the efficiency for direct sunlight is 10-20%, in certain examples.

Certain example assemblies, e.g., of FIGS. 11, 12, and/or 13, may function as a self-regulating window, in certain example embodiments. For example, substantially only diffuse daylight may be transmitted through the substrates into the structure upon which the assembly is disposed, in certain example embodiments. The diffuse daylight may constitute about 15% of the total maximum irradiation from the sun, in certain example embodiments. In certain example situations, the amount of diffuse daylight may remain substantially constant regardless of the sun's position throughout the course of a day. During cloudy or inclement weather, or when the sun moves temporarily behind a cloud, an assembly may still transmit most of the light to the interior of a building, since most of it (or even all of it in certain instances) is diffuse. When the sun reappears, the total irradiation may increase by a factor of about 6, although the photovoltaic skylight system may advantageously only transmit about the same amount of light (e.g., 15% of the total). In other words, in certain instances the assembly may selectively block direct solar radiation only (e.g., because the solar radiation is absorbed by the solar strips). Thus, the assembly may have a variable solar heat gain control, in that it blocks most of the heat associated with direct sunlight (again, e.g., because the direct solar radiation—such as that from direct sunlight—is absorbed before it can be transmitted through the bottom substrate). Certain example assemblies may thus permit a reduction in electricity bills for air-conditioning.

Furthermore, because of the direct sunlight being absorbed by the solar cell strips (e.g., for the generation of electricity), diffuse daylight is the primary light entering the building. This may help reduce the glare from direct sunlight. The transmitted diffuse daylight may reduce the need for artificial lighting in the building, without substantially increasing the ambient temperature within the building. In other words, integrating example embodiments of assemblies described herein, e.g., as a skylight, window, or the like, in a building may advantageously increase lighting within the building without increasing the temperature, decrease the need for artificial lighting, and of course, provide an additional source of electricity. Accordingly, certain example assemblies described herein may reduce energy usage and/or utility costs in multiple ways. In addition, daylight tends to promote health and productivity of the occupants of a building, as shown in many studies.

As described above, certain example embodiments assemblies described herein (e.g., windows, skylights, dual and/or triple glazings, etc.) may advantageously provide a degree of thermal insulation in certain example embodiments. Certain example assemblies described herein may be double or triple glazing units. In this regard, in some cases, an additional degree of thermal insulation may be provided as a result.

Further, to provide additional thermal insulation for a building, low-emissivity coatings may be provided on one or more of the interior glass surfaces. In certain example embodiments, the degree of additional thermal insulation provided may advantageously enable the cost of heating to be reduced. This may also advantageously reduce utility bills, energy usage, etc. Additional example low-E coatings are described in U.S. Pat. Nos. 6,686,050, 6,723,211, 6,782, 718, 6,749,941, 6,730,352, 6,802,943, 4,782,216, 3,682,528, and 6,936,347, the disclosures of which are hereby incorporated herein by reference.

In certain example embodiments, if it is desired that more light reach the interior of the building (e.g., temporarily), the system may be programmed to move the solar cell strips out of the focus line of the solar light. This may be occasionally valuable in providing increased light (daylight), including direct solar radiation, to the interior of the building. However, in this situation, the production of electricity may be reduced and/or stopped, in certain examples. This is simply an additional advantage related to certain example aspects of the assemblies disclosed herein.

Thus, it will be appreciated that certain example assemblies described herein may advantageously be installed at a latitude tilt, and therefore may have increased electricity output, the assemblies may provide daylight entry into the building, and also may also provide thermal insulation (e.g., as a dual and/or triple glazing). Furthermore, certain assemblies may also advantageously provide self-regulating or dynamic solar heat control, and a low Solar Heat Gain Coefficient if and/or when needed under direct sunlight.

In certain example embodiments, the multi-functionality of example assemblies described herein may cause these assemblies to be a much more attractive building-integrated photovoltaic system than existing/conventional BIPV systems. In some circumstances, electricity generation by itself may not be seen as enough of a benefit to justify an investment in BIPV technology. However, by adding thermal insulation, variable solar heat gain control, and diffuse daylight entry, certain example embodiments of the assemblies of or including improved BIPV systems described herein (e.g., windows, skylights, etc., comprising double and/or triple glazings, insulating glass units, and the like) may provide a more comprehensive solution for energy efficient buildings.

It will be appreciated that the improved BIPV systems disclosed herein may be used in connection with an IGU-inclusive photovoltaic skylight) and may be installed on commercial roofs, for example, roofs of factories, warehouses, office buildings, large stores, schools, shopping centers, etc. For example, an IGU-inclusive photovoltaic skylight system may be advantageous in any scenario where a combination of electricity generation, thermal insulation, solar heat gain control, and/or daylight entry may reduce the utility and/or operational costs of the building.

FIGS. 17(*a*)-(*e*) show, schematically, a view of an example multifunctional BIPV concentrating solar photovoltaic skylight 1700 in accordance with certain example embodiments. More particularly, FIG. 17(*a*) is a front view thereof, FIG. 17(*b*) is an isometric view thereof, FIG. 17(*c*) is a view through section A-A of FIG. 17(*a*), FIG. 17(*d*) is a view through section B-B of FIG. 17(*a*), and FIG. 17(*e*) is an enlargement of detail C from FIG. 17(*b*). First, second, and third substrates 1702, 1704, and 1706 are provided, in this order, from exterior to interior. The first substrate 1702 may be a cover glass substrate, the second substrate 1704 may be an actuating inner optical glass substrate in certain example embodiments (e.g., it may include or support the lenticular array), and/or the third substrate 1706 may support the strip solar cells. However, in certain different example embodiments, the first substrate 1702 may include or support the lenticular array while the second glass substrate supports the strip solar cells and is movable relative to the fixed lenticular array. In such cases, the third substrate 1706 may be a protective substrate. The exterior frame 1708 may be provided between the first and third substrates 1702 and 1706 and help to keep them in substantially parallel and spaced apart relation to one another. It also may directly or indirectly support the second glass substrate 1704, e.g., via the servo motor.

For instance, in certain example embodiments, a pin 1710 may connect the second glass substrate 1704 to a body portion 1712 of the servo motor. When the servo motor is actuated, it will cause the servo motor rod 1714 (which may include magnets in certain example embodiments) to expand or contract, causing the second substrate 1706 that is connected thereto via the pin 1710 to be correspondingly displaced. Movement may be facilitated by providing one or more sliders 1716 that roll on or otherwise travel along a compact rail 1718 disposed on one or both sides thereof.

As alluded to above, the servo motor may be a linear motor inside of the frame that helps control the lateral movement of the second substrate 1704. A microcontroller may be programmed to cause the servo motor to move, e.g., based on the time of day and/or based on feedback from a photo-detector or the like. The total movement may be about 1 cm during the day based on, for example the latitude tilt or the like. The movement may take place slowly, e.g., about 0.01 to 0.1 mm once every 10 min. to accomplish the full movement throughout the day, thereby enabling the servo to consume a low amount of power. Advantageously, the system is protected by the inner and outer first and third substrates 1702 and 1706. Thus, the need to protect the system from external forces (e.g., high winds, hail, etc.) is reduced.

As indicated above, the skylight advantageously becomes self-regulating. In some cases, only about 15% of the total maximum irradiation, which corresponds to diffuse light, is transmitted into the building. Direct solar radiation is blocked, thereby enabling variable solar heat gain control, e.g., such that heat is blocked when most appropriate (e.g., under full sunlight), which can in turn lead to heating/cooling advantages, etc.

According to certain example embodiments, lateral tracking of a solar cell strip substrate relative to a lenticular array that concentrates light thereon advantageously results in cost-effective electricity generation, self-regulated solar heat gain control, and diffuse daylight entry, thereby providing a multifunctional BIPV product. The concentration ratio preferably is at least 2:1, more preferably at least about 3:1, although high concentration ratios are possible. In some instances, heat sinks may be provided to keep the assembly cool, e.g., when high concentration ratios are provided.

According to certain example embodiments, the lens array does not move at all, but the PV array glass moves laterally to keep direct sunlight focused on the solar cell strips, although this arrangement may be reversed in certain example embodiments, and both elements may move in yet other example embodiments.

Although certain example embodiments are directed to multifunctional photovoltaic skylights, it will be appreciated that it may in some cases be desirable to provide more static versions of BIPV products. For instance, a static or semi-static skylight that is either fixed in one position or changeable between a few (e.g., 2, 3, 4, etc.) predefined positions may in some cases be desirable. Indeed, it will be appreciated that static or semi-static BIPV products (such as windows, skylights, and/or the like) may be seen as desirable in situations where it would be advantageous to reduce complexity at the expense of performance.

Indeed, static embodiments lack moving parts, and semi-static embodiments may include a very small set of moving parts that are only seasonally adjusted, potentially manually. Thus, static and semi-static embodiments may be simpler to manufacture and operate, and may be easier to make reliable for the predicted lifetime of at least 25 years for windows in commercial and/or residential settings, as compared to embodiments that include parts that move relatively continuously.

As described above, e.g., in connection with FIG. 11, a photovoltaic strip array may move relative to the lens array during the course of the day. The width of the solar cell may be about one third of the lens width, and the cylindrical axis of the lens array may be oriented vertically to the ground, which advantageously may enable a low power linear motor to move the photovoltaic array substrate without much force, e.g., because the photovoltaic array is moving generally sideways, and not up and down or along a steep incline. The FIG. 11 arrangement may also be advantageous in that the lens array may be kept cleaner and therefore more effective by allowing occasional rain to stream down the grooves of the lens array, e.g., when the lens array is an outermost substrate.

Figure 18A:
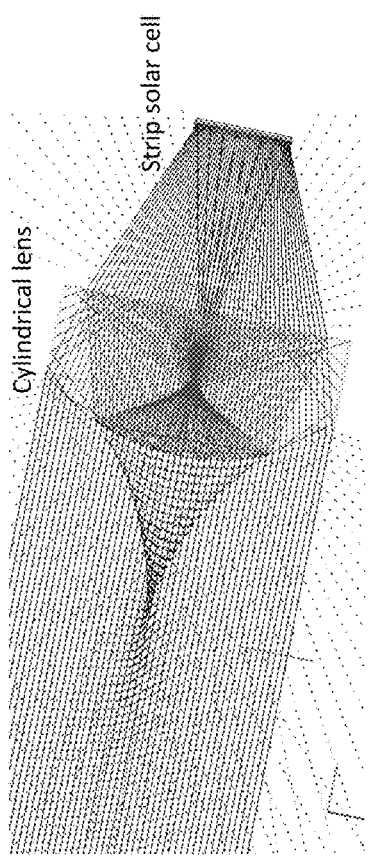
FIGS. 18(a)-18(b) are ray tracing models of a cylindrical lens and PV cell in accordance with the FIG. 11 embodiment, under normal incidence of the sun and under a 30 degree incidence of the sun, respectively.
Figure 18B:
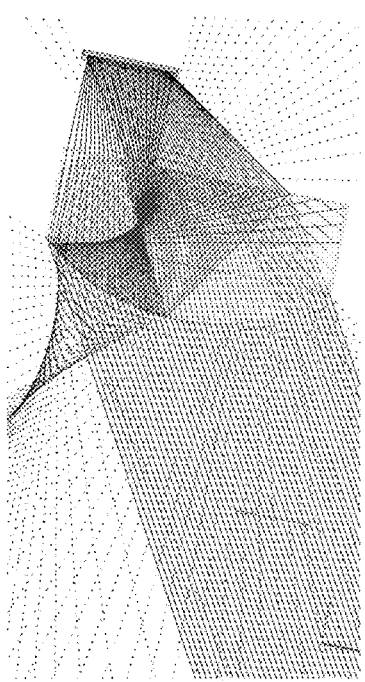

FIGS. 18(*a*)-18(*b*) are ray tracing models of a cylindrical lens and PV cell in accordance with the FIG. 11 embodiment, under normal incidence of the sun and under a 30 degree incidence of the sun, respectively. As will be appreciated from these two drawings, the solar cell moves laterally to keep all or most of the direct incident light on the solar cell.

Figure 19:
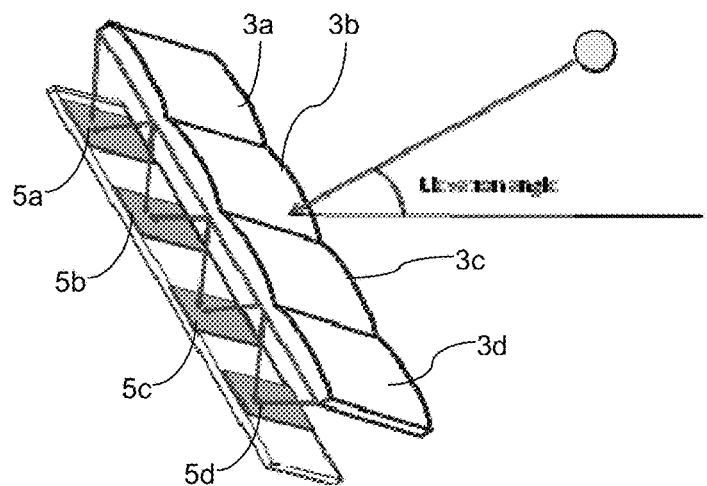
FIG. 19 is a static photovoltaic skylight with a lens array oriented horizontally, and where the cylindrical axis of the lens array is parallel to the ground, in accordance with certain example embodiments.

For a static version of the photovoltaic skylight without moving parts, however, it is advantageous to have the cylindrical axis of the lens array parallel to the ground, e.g., as shown in FIG. 19. In other words, FIG. 19 is a static photovoltaic skylight with a lens array oriented horizontally, and where the cylindrical axis of the lens array is parallel to the ground, in accordance with certain example embodiments.

Figure 20:
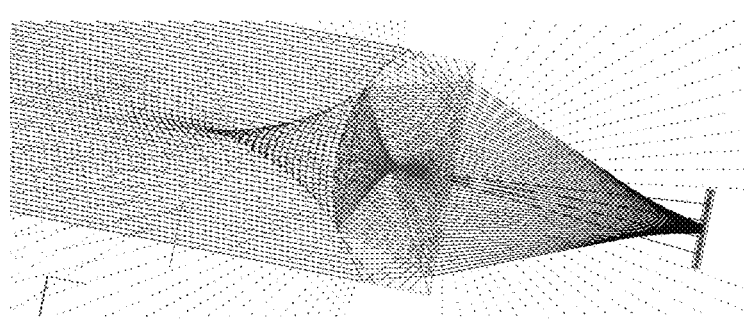
FIG. 20 is an example ray tracing model of the FIG. 19 cylindrical lens and photovoltaic cell under normal incidence of the sun.

Instead of placing the solar cell at a position in which it is uniformly illuminated (e.g., at a 3× concentration), the solar cell is moved further back, so that it is closer to the focal point of the lens. This may be appreciated from FIGS. 19 and 20, the latter of which is an example ray tracing model of the FIG. 19 cylindrical lens and photovoltaic cell under normal incidence of the sun. By moving the solar cell back, the incident angle of the direct solar illumination is allowed to vary over a certain angle, e.g., for long durations of time such as, for example, during different seasons (but not necessarily during any single given day), while all or most of the direct sunlight remains on the photovoltaic chip without needing to move the chip (or the lenses). In other words, the example FIG. 19 system is static, without moving parts, but still captures most direct sunlight during the middle of the day, when most needed. This advantageous aspect stems from the realization that during a given day, the angle of solar incidence changes only very little, since the angle of solar incidence basically moves only parallel to the cylindrical axis of the array, rather than perpendicular to it. Any time period may be used, but the middle of the day is preferred in certain example embodiments. The middle of the day may be, for example, from about 11 am to 4 pm, or any sub-range (e.g., 12 pm to 2 pm) therein. Preferably, all or substantially all illumination includes more than 50% of solar illumination, more preferably more than 75%, and still more preferably more than 85%. Sometimes 90-95% and even higher amounts of direct solar illumination may be captured.

When the ratio of solar cell width to lens width is increased (and thus there is more silicon area coverage), the direct sunlight will remain focused on the solar cell for a longer period during the day, e.g., depending on the orientation (tilt) of the panel installation and the time of the year. Therefore, there is a tradeoff between annual solar cell energy output and solar cell cost vs. diffuse light transmission into the building, based on the varying of the dimensions and/or configurations (e.g., the width) of the solar cell strip relative to the lens width. However, this tradeoff can be balanced in a static system, e.g., to achieve a target Solar Heat Gain Coefficient (SHGC) value at a specific time (e.g., season of the year).

In static photovoltaic skylight embodiments, the illumination of the photovoltaic chip by sunlight may be non-uniform and may travel across the chip. This can lead to temperature non-uniformities in the solar cell, e.g., with higher temperatures in the area with higher illumination. It also may lead to reductions in the fill factor and open circuit voltage. The effects of non-uniform illumination on solar cell output also are known. It is noted, however, that the negative effects of non-uniform illumination can be mitigated by proper placement of good heat sinks, proper cell design (such as, for example, low series resistance metal contacts for both positive and negative connections including, for instance, those used in back contact only solar cells), etc. Thus, certain example embodiments contemplate static arrangements with such features, which may help ameliorate these and/or other negative effects related to non-uniform heating.

Figure 21:
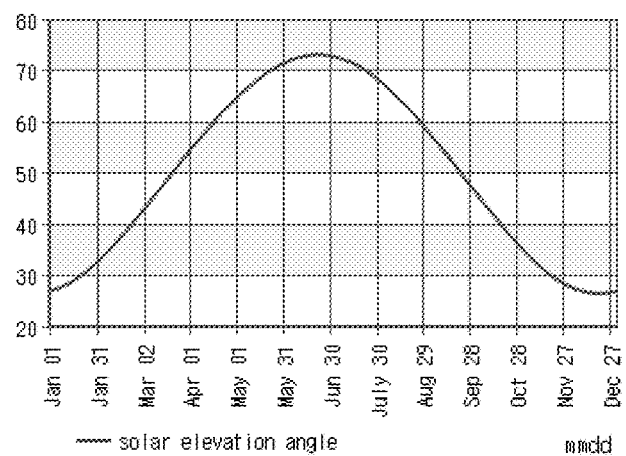
FIG. 21, which is a graph plotting the solar elevation angle vs. time at +40 degrees at 12 pm.

The elevation of the sun depends on latitude, time of day, and season. An example of the seasonal variation is shown in FIG. 21, which is a graph plotting the solar elevation angle vs. time at +40 degrees latitude at 12 pm. Thus, it will be appreciated that the static embodiment described above can become more effective in blocking direct light and converting it into electricity over the course of the year, if there is some periodic (e.g., seasonal adjustment) of the relative position between the photovoltaic array and the lens array, but without necessarily having to change the relative position within a given day or even on a day-to-day basis. For example, the relative position may be changed, weekly, monthly, quarterly, etc. Such relative position changes may be made manually by a human operator, or automatically. For instance, a programmable controller may actuate a mechanized movement system based on date (e.g., such that the desired monthly, quarterly, or other change in position is accomplished), temperature (e.g., for SHGC regulating purposes), and/or other factors.

Figure 22A:
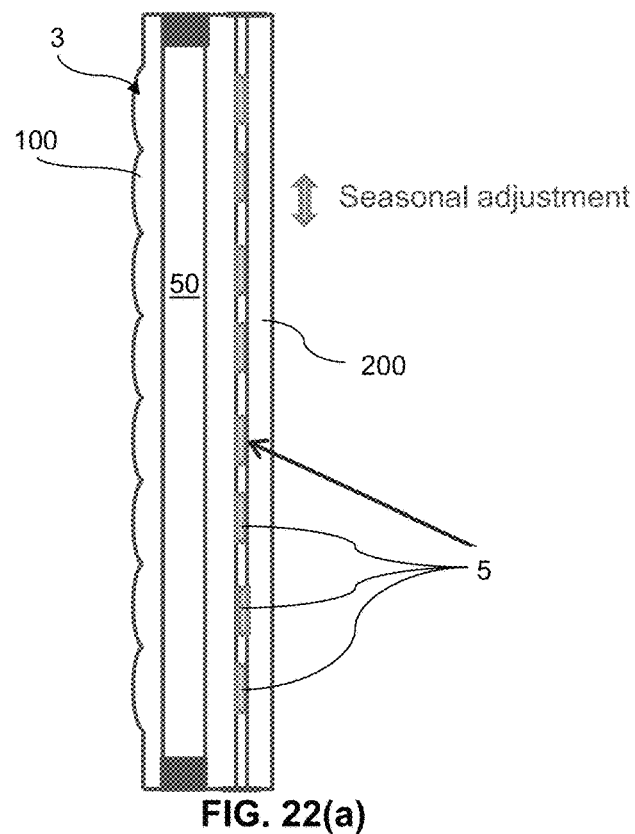
FIGS. 22(a)-22(b) are semi-static photovoltaic windows in which the position of the photovoltaic array is seasonally or otherwise adjusted (e.g., manually or automatically) in different orientation installations in a façade, in accordance with certain example embodiments.
Figure 22B:
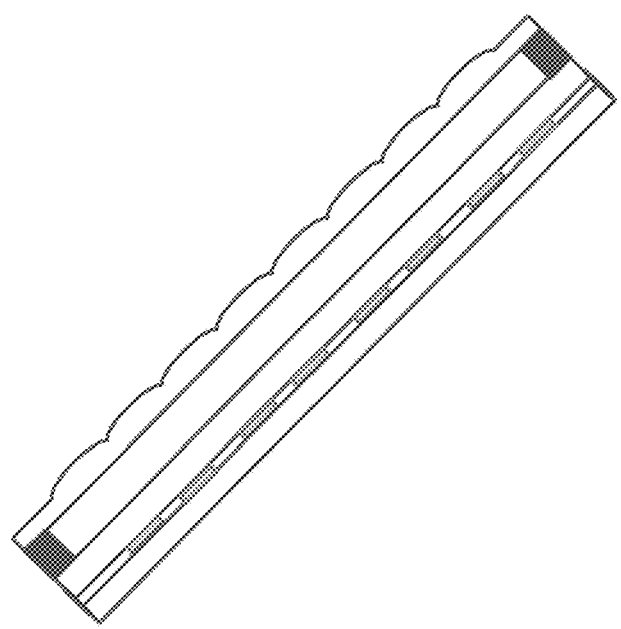

Changes in the relative position between the photovoltaic array and the lens array may be made possible if the frame is semi-rigid, if the photovoltaic cells are suspended on a rigid or flexible substrate or grid with some degree of seasonal adjustment, etc. Another example of a mechanism in which two glass substrates can be moved relative to each other is a conventional residential window that can be opened by sliding vertically. If the outside lite of such a structure is a horizontally oriented lens array covering the entire window area and the inside lite (which can be moved up and down and would cover most of the window area) contains the horizontally oriented PV strip array, for example, their relative position may be seasonally or otherwise adjusted to block direct radiation for most of the day. This arrangement is shown in FIG. 22(a), which is a semi-static photovoltaic window in which the position of the photovoltaic array is seasonally or otherwise adjusted (e.g., manually or automatically) in a vertical installation in a façade, in accordance with certain example embodiments. Because this would not necessarily be "vision glass" suitable for window application, it is preferably installed at the bottom or top of a window. By tilting the structure, e.g., as shown in FIG. 22(b), a skylight for a roof may be obtained, and such an assembly may not necessarily require "vision glass."

The relative position of the photovoltaic array to the lens array may depend on the latitude at installation and on the tilt of the system, e.g., so that direct light interception is maximized, if so desired. The seasonal or other adjustment of the relative position may further optimize direct light blocking and electricity generation, if so desired. In certain static and semi-static embodiments, the various positions may be predefined and fixed (e.g., in terms of notches, grooves, or other features) such that they are easily locatable by a manual human operator. In some instances, different versions may be sold for different regions (e.g., Mid-Atlantic U.S., Midwest U.S., Southeast U.S., and/or other optimized versions), etc. In embodiments where automatic movement features are provided, the location of the dwelling may be specified (e.g., on a precise latitude and/or longitude basis using, for example a GPS or other device; on a city, county, state, geographic (e.g., Mid-Atlantic U.S., Midwest U.S., Southeast U.S., etc.), or other designation, etc.), and a programmable controller may be so instructed. For instance, a lookup table stored to a non-transitory computer readable storage medium or the like may be consulted by the programmable controller once a zip code or the like is provided, etc. The relative position of the solar cell strips relative to the lens array may additionally or alternatively be controlled directly by the maximum PV output at a certain time of the year. In other words, there may be a feedback from the PV power output to the lateral setting of the PV array so as to increase or maximize PV output.

In static, semi-static, and laterally moving example embodiments, there is a tradeoff between how the lens array can be used to concentrate the direct component of solar insolation onto strips of photovoltaic cells, and how then can be positioned to allow diffuse light components to pass through gaps between adjacent photovoltaic cell strips.

It will be appreciated that the edge seal and other features of the laterally moving embodiments may be used in connection with static and semi-static versions of the skylight. It also will be appreciated that the heat sink, cell design, and other design features discussed above that may help address non-uniform illumination issues may be used in connection with any of these embodiments.

For semi-static and laterally moving example embodiments in particular, it is possible to provide arrangements (e.g., skylights) that have a dynamic SHGC or SHGC varying by season. It will be appreciated that certain example embodiments may have a dynamic, varying SHGC but may be self-regulating. In certain example embodiments and as alluded to above, however, SHGC may vary by season such that, for example, the SHGC may change per season in the static version. In the semi-static version, the SHGC may be changed by the occupant of the building to emphasize maximum daylight entry, maximum PV output, or anything in between. As one example, the strips relative to the concentrating lens array may be positioned based on the warmness and coolness of the winter and summer months. That is, the light may be concentrated such that it is completely or at least in significant part incident on the photovoltaic cell strips during the warmer summer months, whereas the light may be allowed to pass into the structure in which the assembly is disposed during the colder winter months by being focused only in part on the photovoltaic cell strips. Thus, a building may be kept cooler in the summer months by virtue of the light impinging upon the photovoltaic cell strips, whereas that building may be kept warmer in the winter months by virtue of less of the light impinging upon the photovoltaic cell strips and more of the light being allowed to pass into the building. In example embodiments where automatic movement is enabled, temperature sensors also may be used to provide for dynamic SHGC. For instance, more light may be transmitted as successively lower indoor and/or outdoor temperatures are reached, more light may be absorbed as successively higher indoor and/or outdoor temperatures are reached, etc.

It also will be appreciated that static embodiments may incorporate similar SHGC control, e.g., by careful placement of the lenses relative to the strips. That is, as is well known, the sun is "higher in the sky" in the summer months and at a lower position in the winter months. See, for example, FIG. 21, and the related discussion above. Thus, a static array can be designed to take the sun's angle into account, with a large predetermined average amount of incident light being absorbed in the summer months and a smaller predetermined average amount of incident light being absorbed in the winter months.

Because the floor of the building likely will be far from the focal length, transmitted light generally will not be concentrated. However, the glass may be made to diffuse the light using commonly known methods. For instance, one or more surfaces (e.g., an innermost surface of the assembly) may be textured with features of a desired size, thin film coatings with predetermined feature sizes may be used, diffusing films may be provided, etc.

Figure 23A:
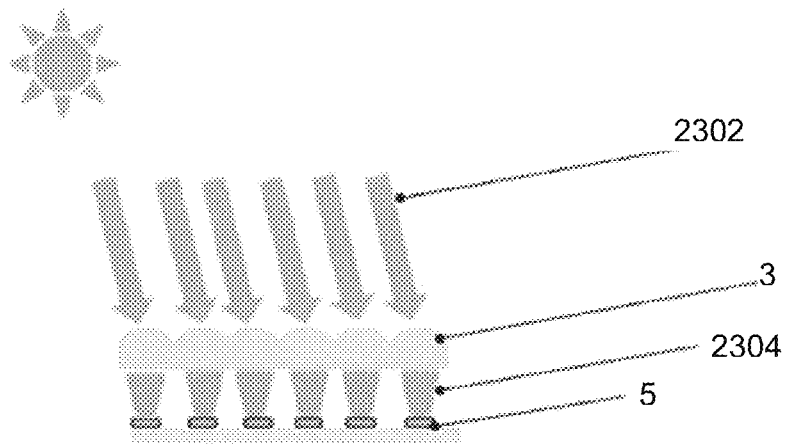
FIGS. 23(a)-23(b) schematically demonstrate SHGC tuning principles in accordance with certain example embodiments.
Figure 23B:
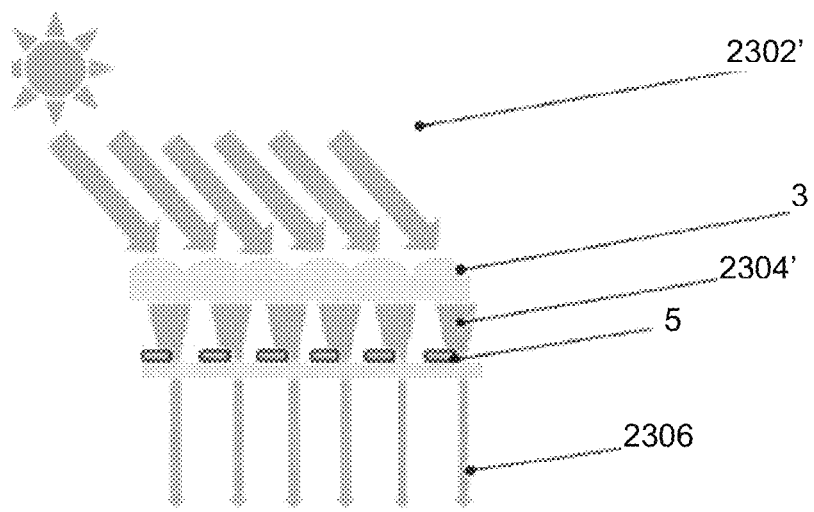

FIGS. 23(a)-23(b) schematically demonstrate SHGC tuning principles in accordance with certain example embodiments. More particularly, FIG. 23(a) shows the sun being "higher" as is typical for summer months, whereas FIG. 23(b) shows the sun being "lower" as is typical for winter months. As shown in FIG. 23(a), the direct component of insolation 2302 impinges upon the lens array 3. The lens array 3 is positioned so that, during the summer months in which the sun is higher, the focused light 2304 impinges upon the strips 5 such that little light is passed through the substrate supporting the strips 5. As a result, the SHGC is low, and the interior of the building is kept cooler as a result of the lower fraction of solar radiation admitted through the window. In contrast with FIG. 23(a), in FIG. 23(b), the direct component of insolation 2302' impinges upon the lens array 3 at a lower angle. The lens array 3 is positioned so that, during the winter months, the focused light 2304' impinges upon the strips 5 such that a substantial amount of light 2306 is passed through the substrate supporting the strips 5. As a result, the SHGC is high, and the interior of the building is warmed as a result of the higher fraction of solar radiation admitted through the window.

The FIG. 23(a)-23(b) example shows two example scenarios, although it will be appreciated that such scenarios could be generalized to reflect what might happen on a quarterly, seasonal, or other basis, for example. Moreover, it will be appreciated that fully movable and/or semi-static embodiments may be put into place to achieve yet more desirable SHGC tuning in certain example embodiments.

As indicated above, certain example embodiments may include low-iron glass. The total amount of iron present is expressed herein in terms of $Fe_2O_3$ in accordance with standard practice. However, typically, not all iron is in the form of $Fe_2O_3$. Instead, iron is usually present in both the ferrous state ($Fe^{2+}$; expressed herein as FeO, even though all ferrous state iron in the glass may not be in the form of FeO) and the ferric state ($Fe^{3+}$). Iron in the ferrous state ($Fe^{2+}$; FeO) is a blue-green colorant, while iron in the ferric state ($Fe^{3+}$) is a yellow-green colorant. The blue-green colorant of ferrous iron ($Fe^{2+}$; FeO) is of particular concern when seeking to achieve a fairly clear or neutral colored glass, since as a strong colorant it introduces significant color into the glass. While iron in the ferric state ($Fe^{3+}$) is also a colorant, it is of less concern when seeking to achieve a glass fairly clear in color since iron in the ferric state tends to be weaker as a colorant than its ferrous state counterpart.

In certain example embodiments of this invention, a glass is made so as to be highly transmissive to visible light, to be fairly clear or neutral in color, and to consistently realize high % TS values. High % TS values are particularly desirable for photovoltaic device applications in that high % TS values of the light-incident-side glass substrate permit such photovoltaic devices to generate more electrical energy from incident radiation since more radiation is permitted to reach the semiconductor absorbing film of the device. It has been found that the use of an extremely high batch redox in the glass manufacturing process permits resulting low-ferrous glasses made via the float process to consistently realize a desirable combination of high visible transmission, substantially neutral color, and high total solar (% TS) values. Moreover, in certain example embodiments of this invention, this technique permits these desirable features to be achieved with the use of little or no cerium oxide.

In certain example embodiments of this invention, a soda-lime-silica based glass is made using the float process with an extremely high batch redox. An example batch redox which may be used in making glasses according to certain example embodiments of this invention is from about +26 to +40, more preferably from about +27 to +35, and most preferably from about +28 to +33 (note that these are extremely high batch redox values not typically used in making glass). In making the glass via the float process or the like, the high batch redox value tends to reduce or eliminate the presence of ferrous iron ($Fe^{2+}$; FeO) in the resulting glass, thereby permitting the glass to have a higher % TS transmission value which may be beneficial in photovoltaic applications. This is advantageous, for example, in that it permits high transmission, neutral color, high % TS glass to be made using raw materials having typical amounts of iron in certain example instances (e.g., from about 0.04 to 0.10% total iron). In certain example embodiments of this invention, the glass has a total iron content ($Fe_2O_3$) of no more than about 0.1%, more preferably from about 0 (or 0.04) to 0.1%, even more preferably from about 0.01 (or 0.04) to 0.08%, and most preferably from about 0.03 (or 0.04) to 0.07%. In certain example embodiments of this invention, the resulting glass may have a % FeO (ferrous iron) of from 0 to 0.0050%, more preferably from 0 to 0.0040, even more preferably from 0 to 0.0030, still more preferably from 0 to 0.0020, and most preferably from 0 to 0.0010, and possibly from 0.0005 to 0.0010 in certain example instances. In certain example embodiments, the resulting glass has a glass redox (different than batch redox) of no greater than 0.08, more preferably no greater than 0.06, still more preferably no greater than 0.04, and even more preferably no greater than 0.03 or 0.02.

In certain example embodiments, the glass substrate may have fairly clear color that may be slightly yellowish (a positive b* value is indicative of yellowish color), in addition to high visible transmission and high % TS. For example, in certain example embodiments, the glass substrate may be characterized by a visible transmission of at least about 90% (more preferably at least about 91%), a total solar (% TS) value of at least about 90% (more preferably at least about 91%), a transmissive a* color value of from −1.0 to +1.0 (more preferably from −0.5 to +0.5, even more preferably from −0.35 to 0), and a transmissive b* color value of from −0.5 to +1.5 (more preferably from 0 to +1.0, and most preferably from +0.2 to +0.8). These properties may be realized at an example non-limiting reference glass thickness of about 4 mm.

In certain example embodiments of this invention, there is provided a method of making glass comprising:

| Ingredient | wt. % |
| --- | --- |
| $SiO_2$ | 67-75% |
| $Na_2O$ | 10-20% |
| CaO | 5-15% |
| total iron (expressed as $Fe_2O_3$) | 0.001 to 0.1% |
| % FeO | 0 to 0.005 | wherein the glass has visible transmission of at least about 90%, a transmissive a* color value of −1.0 to +1.0, a transmissive b* color value of from −0.50 to +1.5, % TS of at least 89.5%, and wherein the method comprises using a batch redox of from +26 to +40 in making the glass.

In certain example embodiments of this invention, there is provided glass comprising:

| Ingredient | wt. % |
| --- | --- |
| SiO$_2$ | 67-75% |
| Na$_2$O | 10-20% |
| CaO | 5-15% |
| total iron (expressed as Fe$_2$O$_3$) | <=0.1% |
| % FeO | <=0.005 |
| glass redox | <=0.08 |
| antimony oxide | 0 to less than 0.01% |
| cerium oxide | 0 to 0.07% | wherein the glass has visible transmission of at least 90%, TS transmission of at least 90%; a transmissive a* color value of −1.0 to +1.0, a transmissive b* color value of from −0.5 to +1.5.

In still further example embodiments of this invention, there is provided solar cell comprising: a glass substrate; first and second conductive layers with at least a photoelectric film provided therebetween; wherein the glass substrate is of a composition comprising:

| Ingredient | wt. % |
| --- | --- |
| SiO$_2$ | 67-75% |
| Na$_2$O | 10-20% |
| CaO | 5-15% |
| total iron (expressed as Fe$_2$O$_3$) | <=0.1% |
| % FeO | <=0.005 |
| glass redox | <=0.08 |
| antimony oxide | 0 to less than 0.01% |
| cerium oxide | 0 to 0.07% | wherein the glass substrate has visible transmission of at least 90%, TS transmission of at least 90%; a transmissive a* color value of −1.0 to +1.0, a transmissive b* color value of from −0.5 to +1.5.

As used herein, the terms "on," "supported by," and the like should not be interpreted to mean that two elements are directly adjacent to one another unless explicitly stated. In other words, a first layer may be said to be "on" or "supported by" a second layer, even if there are one or more layers therebetween.

In certain example embodiments, a skylight is provided. A lenticular array is provided along a common axis. A substrate supports a plurality of generally elongate solar cell strips. The lenticular array and the substrate are oriented relative to one another such that the skylight has different solar heat gain coefficients (SHGCs) during at least first and second times of the year, respectively.

In addition to the features of the previous paragraphs, in certain example embodiments, the first and second times of the year may correspond to summer and winter months respectively, and/or the SHGC for the first time of the year may be lower than the SHGC for the second time of year.

In addition to the features of either of the two previous paragraphs, in certain example embodiments, the skylight may be structured such that each season and/or month of the year has a different respectively selected SHGC.

In addition to the features of any of the three previous paragraphs, in certain example embodiments, the lenticular array may comprise a plurality of lenses.

In addition to the features of any of the four previous paragraphs, in certain example embodiments, the solar cell strips may comprise c-Si.

In addition to the features of any of the five previous paragraphs, in certain example embodiments, the different SHGCs may be at least partially controlled by designing the skylight such that different amounts of direct sunlight impinge upon the solar cell strips at corresponding times of the year.

In addition to the features of any of the six previous paragraphs, in certain example embodiments, a majority of the light that may pass through the skylight may be diffuse light.

In addition to the features of any of the seven previous paragraphs, in certain example embodiments, an optical diffuser may be provided, e.g., on a major surface of the substrate supporting the plurality of solar cell strips.

In addition to the features of any of the eight previous paragraphs, in certain example embodiments, the lenticular array and the substrate may be fixed in position relative to one another.

In addition to the features of any of the nine previous paragraphs, in certain example embodiments, the lenticular array and the substrate may be movable with respect to one another, as between at least first and second predefined positions, with each said predefined position having an associated SHGC.

In addition to the features of any of the 10 previous paragraphs, in certain example embodiments, a motor may be provided, and the lenticular array and the substrate may be automatically movable with respect to one another in connection with the motor.

In addition to the features of any of the 11 previous paragraphs, in certain example embodiments, means may be provided for manually moving the lenticular array and the solar cells relative to one another between the different predefined positions.

In addition to the features of any of the 12 previous paragraphs, in certain example embodiments, the skylight may be substantially horizontally and/or vertically disposable on a roof, and/or orientable at a tilt selected in dependence on a latitude where the skylight is to be installed.

In addition to the features of any of the 13 previous paragraphs, in certain example embodiments, a programmable controller and a motor may be provided, with the programmable controller potentially being configured to cause the motor to move the lenticular array and the solar cells relative to one another between the different predefined positions based on, for example, a date and/or a temperature reading.

In addition to the features of any of the 14 previous paragraphs, in certain example embodiments, lenses in the lenticular array may be provided along a common cylindrical axis that is substantially parallel to the ground.

In certain example embodiments, a building integrated photovoltaic (BIPV) product is provided. An array of lenses is provided along a common axis. A substrate supports a plurality of generally elongate solar cell strips. The array of lenses and the substrate are oriented relative to one another such that the skylight has different solar heat gain coefficients (SHGCs) during at least first and second times of the year, respectively. The different SHGCs are at least partially controlled by designing the skylight such that different amounts of direct sunlight impinge upon the solar cell strips at corresponding times of the year.

In addition to the features of the previous paragraphs, in certain example embodiments, the BIPV product may be structured such that each season and/or month of the year has a different respectively selected SHGC.

In addition to the features of either of the two previous paragraphs, in certain example embodiments, a diffuser may be provided, e.g., in connection with the substrate supporting the solar cell strips and may be optically structured to help ensure that a majority of the light that may pass through the BIPV product is diffuse light.

In addition to the features of any of the three previous paragraphs, in certain example embodiments, the array of lenses and the substrate may be fixed in position relative to one another.

In addition to the features of any of the four previous paragraphs, in certain example embodiments, the array and the substrate may be movable with respect to one another, as between at least first and second predefined positions, with each said predefined position having an associated SHGC.

In addition to the features of any of the five previous paragraphs, in certain example embodiments, a motor may be provided, e.g., with the lenticular array and the substrate optionally being automatically movable with respect to one another in connection with the motor.

In addition to the features of any of the six previous paragraphs, in certain example embodiments, the BIPV product may be substantially horizontally and/or vertically disposable on a roof and/or orientable at a tilt selected in dependence on a latitude where the skylight is to be installed.

In certain example embodiments, method of making a window (e.g., a skylight or the like) is provided. For example, a building integrated photovoltaic (BIPV) product may be made in accordance with the method of any of seven paragraphs may be built into the window.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A skylight, comprising:
    first and second glass substrates arranged substantially in parallel and spaced apart from each other;
    a first gap between the first and second glass substrates;
    an inert gas in the gap;
    a lenticular array provided along a common axis, the lenticular array comprising first and second sub-lens arrays, each sub-lens array comprising plano-convex lenses, the first and second sub-lens arrays being laminated to one another via laminating material comprising polyvinyl butyral (PVB) such that the planar sides of the first and second sub-lens arrays are adjacent to one another and contact the laminating material; and
    the second glass substrate supporting a plurality of generally elongate solar cell strips,
    wherein the lenticular array and the glass substrates are oriented relative to one another such that the skylight has different solar heat gain coefficients (SHGCs) at the same time of day during at least first and second times of the year, respectively, and wherein the lenticular array and the second substrate are movable with respect to one another, as between at least first and second predefined positions, each said predefined position having an associated SHGC.

2. The skylight of claim 1, wherein the first and second times of the year correspond to summer and winter months respectively, and wherein the SHGC for the first time of the year is lower than the SHGC for the second time of year.

3. The skylight of claim 1, wherein the skylight is structured such that each season of the year has a different respectively selected SHGC.

4. The skylight of claim 1, wherein the skylight is structured such that each month of the year has a different respectively selected SHGC.

5. The skylight of claim 1, wherein the solar cell strips comprise c-Si.

6. The skylight of claim 1, wherein the different SHGCs are at least partially controlled by designing the skylight such that different amounts of direct sunlight impinge upon the solar cell strips at corresponding times of the year.

7. The skylight of claim 1, wherein a majority of the light that may pass through the skylight is diffuse light.

8. The skylight of claim 1, further comprising a motor, wherein the lenticular array and the second substrate are automatically movable with respect to one another in connection with the motor.

9. The skylight of claim 1, further comprising means for manually moving the lenticular array and the solar cells relative to one another between the different predefined positions.

10. The skylight of claim 1, being substantially horizontally and/or vertically disposable on a roof.

11. The skylight of claim 1, being orientable at a tilt selected in dependence on a latitude where the skylight is to be installed.

12. The skylight of claim 1, further comprising a programmable controller and a motor, the programmable controller being configured to cause the motor to move the lenticular array and the solar cells relative to one another between the different predefined positions based on a date and/or a temperature reading.

13. The skylight of claim 1, wherein lenses in the lenticular array are provided along a common cylindrical axis that is substantially parallel to the ground.

14. A building integrated photovoltaic (BIPV) product, comprising:
    first and second glass substrates arranged substantially in parallel and spaced apart from each other;
    a first gap between the first and second substrates;
    an inert gas in the first gap;
    a lenticular array comprising first and second sub-lens arrays, each sub-lens array comprising plano-convex lenses, the first and second sub-lens arrays being laminated to one another via laminating material comprising polyvinyl butyral (PVB) such that the planar sides of the first and second sub-lens arrays are adjacent to one another and each of the planar sides contacting the laminating material; and
    the second substrate supporting a plurality of generally elongate solar cell strips,
    wherein the lenticular array and the substrates are oriented relative to one another and configured such that the product has different solar heat gain coefficients (SHGCs) at the same time of day during at least first and second times of the year, respectively, and such that different amounts of direct sunlight impinge upon the solar cell strips at the first and second times of the year, and wherein the lenticular array and the second substrate are movable with respect to one another, as between at least first and second predefined positions, each said predefined position having an associated SHGC.

15. The BIPV product of claim 14, wherein the BIPV product is structured such that each season and/or month of the year has a different respectively selected SHGC.

16. The BIPV product of claim 14, further comprising a motor, wherein the lenticular array and the second substrate are automatically movable with respect to one another in connection with the motor.

17. The BIPV product of claim 14, being substantially horizontally and/or vertically disposable on a roof and/or orientable at a tilt selected in dependence on a latitude where the skylight is to be installed.

* * * * *